US011252339B2

(12) United States Patent
Bammes et al.

(10) Patent No.: US 11,252,339 B2
(45) Date of Patent: Feb. 15, 2022

(54) APPARATUS AND METHOD FOR HIGH DYNAMIC RANGE COUNTING BY PIXELATED DETECTORS

(71) Applicant: Direct Electron, LP, San Diego, CA (US)

(72) Inventors: Benjamin Bammes, Pearland, TX (US); Robert Bilhorn, San Diego, CA (US)

(73) Assignee: Direct Electron, LP, San Diego, CA (US)

( * ) Notice: Subject to any disclaimer, the term of this patent is extended or adjusted under 35 U.S.C. 154(b) by 109 days.

(21) Appl. No.: 16/851,931

(22) Filed: Apr. 17, 2020

(65) Prior Publication Data
US 2020/0336646 A1 Oct. 22, 2020

Related U.S. Application Data

(60) Provisional application No. 62/836,555, filed on Apr. 19, 2019.

(51) Int. Cl.
*H04N 5/235* (2006.01)
*H04N 5/365* (2011.01)
*H04N 5/341* (2011.01)
*H01J 37/28* (2006.01)
*H04N 5/00* (2011.01)

(52) U.S. Cl.
CPC .......... *H04N 5/2355* (2013.01); *H01J 37/28* (2013.01); *H04N 5/00* (2013.01); *H04N 5/341* (2013.01);
(Continued)

(58) Field of Classification Search
None
See application file for complete search history.

(56) References Cited

U.S. PATENT DOCUMENTS 7,829,860 B2 * 11/2010 Nygard ..................... G01T 1/17
250/370.09
8,135,230 B2   3/2012 Rempel et al.
(Continued)

OTHER PUBLICATIONS

English translation of the International Search Report and Written Opinion of the International Searching Authority dated Aug. 3, 2020 in PCT/US 20/28784, 11 pages.
(Continued)

*Primary Examiner* — Quan Pham
(74) *Attorney, Agent, or Firm* — Oblon, McClelland, Maier & Neustadt, L.L.P.

(57) ABSTRACT

The present disclosure relates to an apparatus and methods for generating a hybrid image by high-dynamic-range counting. In an embodiment, the apparatus includes a processing circuitry configured to acquire an image from a pixelated detector, obtain a sparsity map of the acquired image, the sparsity map indicating low-flux regions of the acquired image and high-flux regions of the acquired image, generate a low-flux image and a high-flux image based on the sparsity map, perform event analysis of the acquired image based on the low-flux image and the high-flux image, the event analysis including detecting, within the low-flux image, incident events by an event counting mode, multiply, by a normalization constant, resulting intensities of the high-flux image and the detected incident events of the low-flux image, and generate the hybrid image by merging the low-flux image and the high-flux image.

20 Claims, 16 Drawing Sheets

(52) U.S. Cl.
CPC .. *H04N 5/3655* (2013.01); *H01J 2237/24592* (2013.01); *H01J 2237/2806* (2013.01); *H01J 2237/2817* (2013.01)

(56) References Cited

U.S. PATENT DOCUMENTS

| | | | |
|---|---|---|---|
| 8,933,401 | B1 | 1/2015 | Reed |
| 9,432,589 | B2 | 8/2016 | Kuang et al. |
| 9,696,435 | B2 | 7/2017 | Gubbens et al. |
| 9,997,331 | B1 | 6/2018 | Own et al. |
| 2007/0023669 | A1* | 2/2007 | Hefetz ................ A61B 6/5235 250/370.14 |
| 2011/0284744 | A1 | 11/2011 | Zewail et al. |
| 2012/0012747 | A1 | 1/2012 | Lazar et al. |
| 2014/0131574 | A1 | 5/2014 | Zewail et al. |
| 2016/0041064 | A1 | 2/2016 | Morishita |
| 2016/0366322 | A1* | 12/2016 | Nishihara ......... H01L 27/14658 |
| 2017/0005126 | A1 | 1/2017 | Yamazaki |
| 2017/0144787 | A1 | 5/2017 | Kim |
| 2017/0329025 | A1 | 11/2017 | Brown et al. |
| 2018/0338078 | A1* | 11/2018 | Cote ................ H04N 5/23254 |
| 2018/0342370 | A1 | 11/2018 | Konyuba et al. |

OTHER PUBLICATIONS

Barnaby D. A. Levin, et al. "4D STEM with a Direct Electron Detector" Microscopy and Analysis, Jan. 30, 2020, 10 pages.
International Search Report and Written Opinion dated Aug. 19, 2020 in PCT/US2020/028814, 16 pages.

* cited by examiner

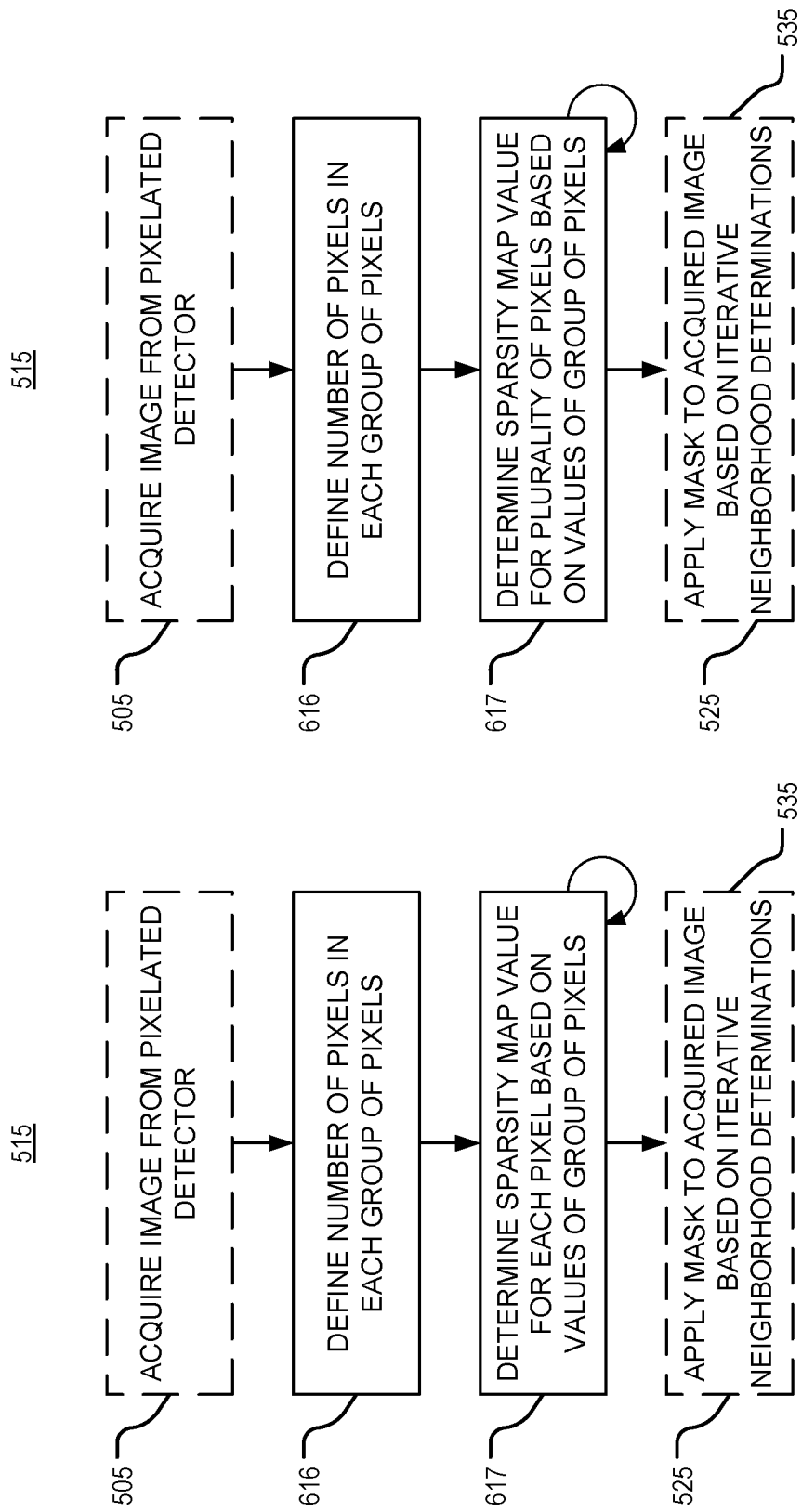

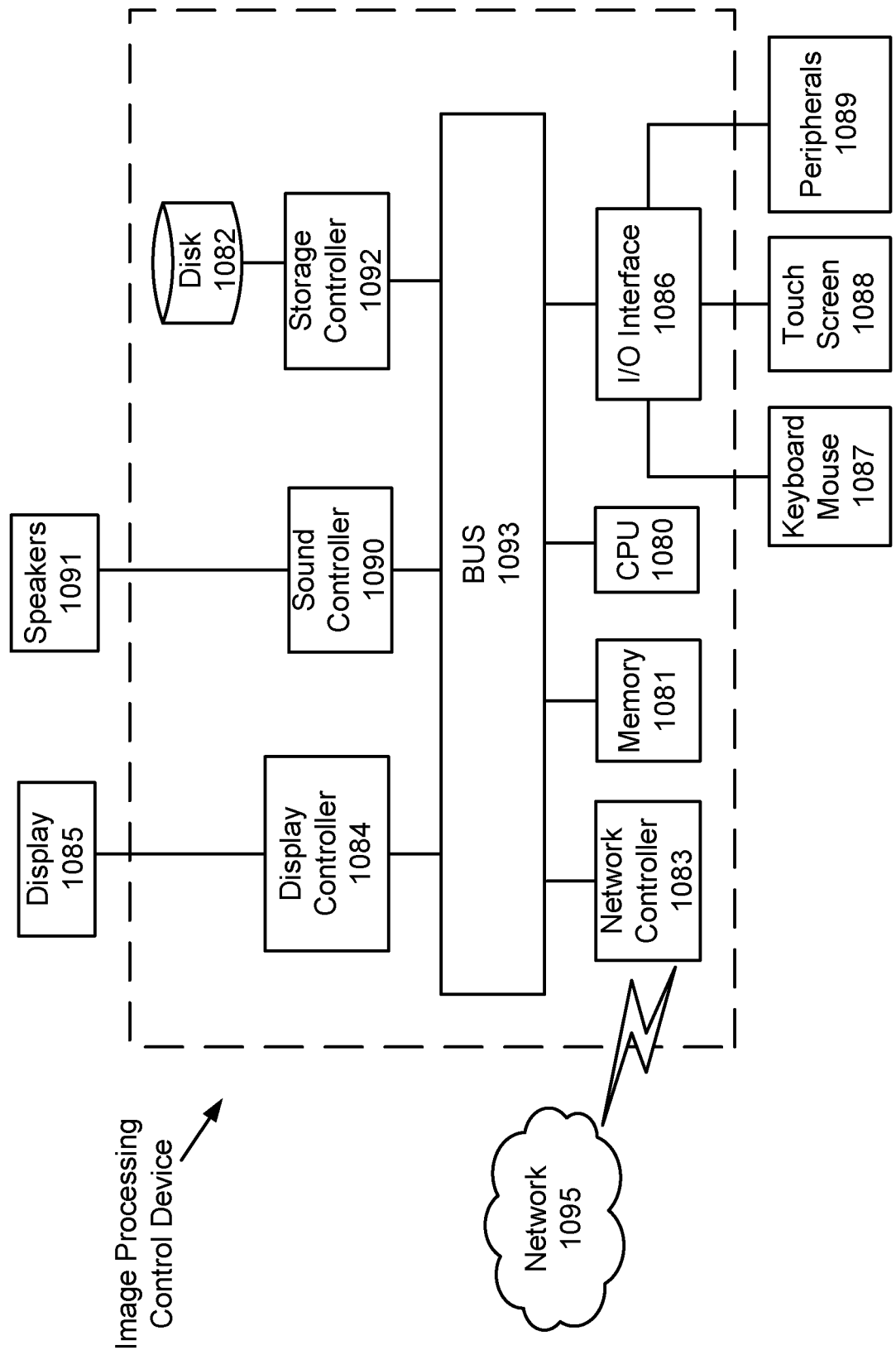

APPARATUS AND METHOD FOR HIGH DYNAMIC RANGE COUNTING BY PIXELATED DETECTORS

CROSS-REFERENCE TO RELATED APPLICATIONS

The present application claims priority to U.S. Provisional Application No. 62/836,555, filed Apr. 19, 2019, the teaching of which is incorporated by reference herein in its entirety for all purposes.

STATEMENT REGARDING GOVERNMENT SUPPORT

This invention was made with government support under Award Number DE-SC0018493 awarded by United States Department of Energy, Office of Science. The government has certain rights to the invention.

STATEMENT REGARDING PRIOR DISCLOSURE BY THE INVENTORS

Aspects of this technology are described in an article "4D STEM with a direct electron detector", published in Microscopy and Analysis, on Jan. 30, 2020, which is incorporated herein by reference in its entirety.

BACKGROUND FIELD OF THE DISCLOSURE

The present disclosure relates to processing an image from a pixelated detector to maximize quality for both low intensity and high intensity regions in an image.

DESCRIPTION OF THE RELATED ART

Different regions within a single image may have different numbers of particles or different amounts of energy that interact with a detector. In the case of a pixelated detector, this may result in certain regions of the pixelated detector receiving a low-flux of particles and other regions of the pixelated detector receiving a high-flux of particles. Typically, researchers are forced to compromise imaging across this spectrum by focusing on optimizing image quality for either high-flux or low-flux, but not both.

For detectors with sufficient sensitivity, even a single particle incident on the detector can be detected. In an ideal case, wherein each incident particle is identical, each detection event should also be identical. However, for most detectors with this level of sensitivity, each detection event varies in its characteristics even if the particles being detected are all identical. For example, some detection events may be isolated to a single pixel on the detector while others may be spread over multiple pixels. Furthermore, some detection events may show a high total intensity while others show a low total intensity. It can be observed that detection events can vary in size, shape, and intensity. In general, this variability in detection events is a source of noise, thus degrading the image quality from the detector.

As a solution to this problem, event counting (also known as electron counting and photon counting, among others) is used to restore the uniformity of each detection event. When the distribution of incident particles on the detector is sufficiently sparse, individual detection events can be distinguished, analyzed, and recorded, such that all detection events from identical incident particles are identical in the recorded image. It can be appreciated that, though event counting will be used herein to refer to electron counting mode, for instance, the methods herein may be applied to other forms of event counting such as photon counting, as suggested above, and helium ion counting, among others.

Many current detectors allow users to switch between operating in counting mode or operating in integrating mode based on whether the particle flux incident on the detector is low or high. This means that users are presently limited to choosing one mode or the other for the entire acquired image. There are many applications, however, such as four-dimensional scanning transmission electron microscopy or electron energy loss spectroscopy, where certain regions of a detector receive a low flux and certain other regions of the detector receive a high flux. In these cases, users are forced to choose either integrating mode or counting mode and face the choice of sacrificing data quality in either the low-flux or high-flux regions of the acquired image. This trade-off is addressed in the present disclosure.

The foregoing "Background" description is for the purpose of generally presenting the context of the disclosure. Work of the inventors, to the extent it is described in this background section, as well as aspects of the description which may not otherwise qualify as prior art at the time of filing, are neither expressly or impliedly admitted as prior art against the present invention.

SUMMARY

The present disclosure relates to an apparatus and method for generating a hybrid image by high dynamic range counting.

According to an embodiment, the present disclosure further relates to an apparatus for generating a hybrid image by high dynamic range counting, comprising processing circuitry configured to acquire an image from a pixelated detector, obtain a sparsity map of the acquired image, the sparsity map indicating low-flux regions of the acquired image and high-flux regions of the acquired image, generate a low-flux image and a high-flux image based on the sparsity map, perform event analysis of the acquired image based on the low-flux image and the high-flux image, the event analysis including detecting, within the low-flux image, incident events by an electron counting mode, multiply, by a normalization constant, resulting intensities of the high-flux image and the detected incident events of the low-flux image, the multiplying normalizing intensity per detected incident event between the low-flux image and the high-flux image, and generate the hybrid image by merging the low-flux image and the high-flux image.

According to an embodiment, the present disclosure further relates to a method for generating a hybrid image by high dynamic range counting, comprising acquiring, by processing circuitry, an image from a pixelated detector, obtaining, by the processing circuitry, a sparsity map of the acquired image, the sparsity map indicating low-flux regions of the acquired image and high-flux regions of the acquired image, generating, by the processing circuitry, a low-flux image and a high-flux image based on the sparsity map, performing, by the processing circuitry, event analysis of the acquired image based on the low-flux image and the high-flux image, the event analysis including detecting, within the low-flux image, incident events by an electron counting mode, multiplying, by the processing circuitry and by a normalization constant, resulting intensities of the high-flux image and the detected incident events of the low-flux image, the multiplying normalizing intensity per detected incident event between the low-flux image and the high-flux image, and generating, by the processing circuitry, the hybrid image by merging the low-flux image and the high-flux image.

According to an embodiment, the present disclosure further relates to a non-transitory computer-readable storage medium storing computer-readable instructions that, when executed by a computer, cause the computer to perform a method of generating a hybrid image by high dynamic range counting, comprising acquiring an image from a pixelated detector, obtaining a sparsity map of the acquired image, the sparsity map indicating low-flux regions of the acquired image and high-flux regions of the acquired image, generating a low-flux image and a high-flux image based on the sparsity map, performing event analysis of the acquired image based on the low-flux image and the high-flux image, the event analysis including detecting, within the low-flux image, incident events by an electron counting mode, multiplying, by a normalization constant, resulting intensities of the high-flux image and the detected incident events of the low-flux image, the multiplying normalizing intensity per detected incident event between the low-flux image and the high-flux image, and generating the hybrid image by merging the low-flux image and the high-flux image.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 6A is a flow diagram of a sub process of a method for generating an image by high dynamic range counting, according to an exemplary embodiment of the present disclosure;

FIG. 6B is a flow diagram of a sub process of a method for generating an image by high dynamic range counting, according to an exemplary embodiment of the present disclosure;

FIG. 10 is a hardware description of an image processing control device for generating an image by high dynamic range counting, according to an exemplary embodiment of the present disclosure.

DETAILED DESCRIPTION

Figure 1:
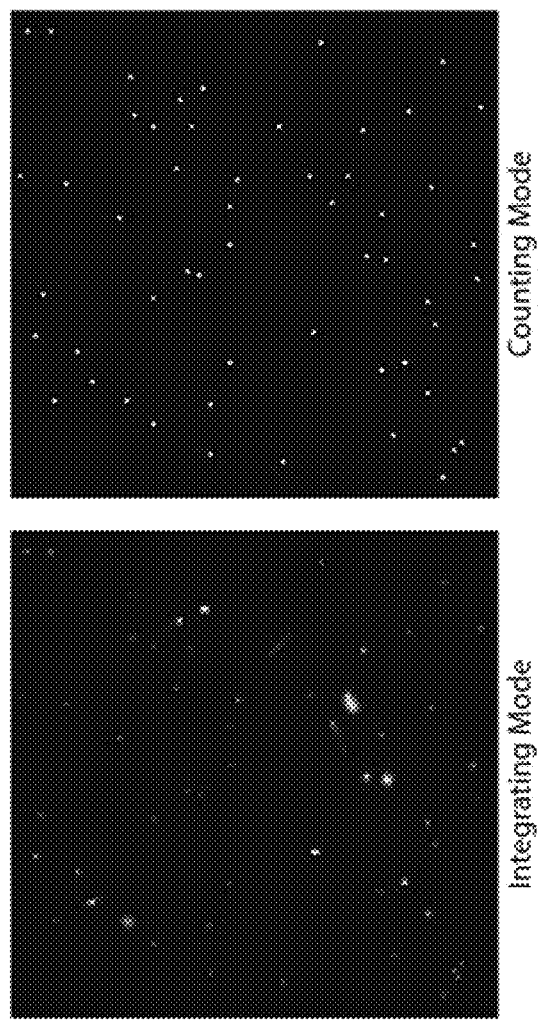
FIG. 1 is an illustration of a region of an image from a detector processed according to integrating mode and counting mode.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). Reference throughout this document to "one embodiment", "certain embodiments", "an embodiment", "an implementation", "an example" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

Different regions within a single image may be generated by different numbers of particles or different amounts of energy that interact with a detector. In the case of a pixelated detector, this may result in certain regions of the pixelated detector receiving a low flux of particles or energy to be detected and other regions of the pixelated detector receiving a high flux of particles or energy to be detected. Typically, researchers compromise imaging across this spectrum by focusing on optimizing their image for either high-flux or low-flux regions.

According to an embodiment, the present disclosure describes an apparatus and method(s) for processing an image from a pixelated detector to maximize image quality for both of low intensity regions, or low-flux regions, and high intensity regions, or high-flux regions, in an acquired image. The method combines two different methods of image formation, integrating mode and event counting mode, such that high intensity regions may be evaluated via integrating mode while low intensity regions, or sparse regions, may be evaluated via event counting mode, or counting mode, thereby avoiding compromises of previous approaches. As such, the apparatus and method(s) of the present disclosure can be described as a hybrid of integrating mode and counting mode for image processing. Following this hybrid approach, each image from integrating mode and from counting mode may be hybridized to generate a single hybrid image with high signal-to-noise ratio (SNR) in low intensity regions of the image while maintaining linearity in high intensity regions of the image.

According to an embodiment, sparse regions in each image may be automatically detected without prior information from the user. In this way, event counting may be performed without manually needing to define, prior to event counting, the position and size of the bright regions and the sparse regions. This is not only convenient for users, but also improves data quality by automatically adapting to the conditions for each image and removing user error.

According to an embodiment, the apparatus and method(s) of the present disclosure are applicable to visible light imaging as well as charged particle imaging including electron microscopy, four-dimensional scanning transmission electron microscopy (4D STEM), and electron energy loss spectroscopy (EELS).

As introduction, it can be appreciated that images of charged particles or photons may be acquired by pixelated detectors, which are arrays of detector elements that are sensitive to the type of particle being recorded. For detectors with sufficient sensitivity, even a single particle incident on the detector can be detected. Ideally, since each incident particle is identical, each detection event should also be identical. However, for most detectors with this level of sensitivity, each detection event varies in its characteristics even if the particles being detected are all identical. For example, some detection events may be isolated to a single pixel on the detector while others may be spread over multiple pixels. Furthermore, some detection events may show a high total intensity while others show a low total intensity. It can be observed that detection events can vary in size, shape, and intensity. In general, this variability in detection events is a source of noise, thus degrading the image quality from the detector.

As a solution to this problem, electron event counting (also referred to herein as electron counting and event counting, among others) can be used to restore the uniformity of each detection event. When the distribution of incident particles on the detector is sufficiently sparse, individual detection events can be distinguished, analyzed, and recorded, such that all detection events from identical incident particles are identical in the recorded image.

In order to be most useful, however, event counting requires that the distribution of incident particles be sufficiently sparse to distinguish single detection events. If the flux of particles is too high, it is challenging to discriminate between multiple detection events that occur simultaneously and in close proximity. This may lead to coincidence loss, meaning that some particles incident on the detector are not recorded and thus image quality is degraded. Therefore, when the flux of particles is high, event counting is generally abandoned and, instead, integrating mode is relied upon, where the total signal deposited on each pixel of the detector may be used without trying to normalize the behavior of each individual detection event. FIG. 1 demonstrates application of integrating mode and counting mode to a same image. It can be appreciated that, though the image of FIG. 1 reflects sparse distribution of incident particles and, accordingly, counting mode provides an improved representation, an opposite effect may be realized as particle flux overburdens the capabilities of a photon counting approach.

Many current detectors allow users to switch between operating in counting mode or integrating mode based on whether the particle flux incident on the detector is low or high. This is to say that users are presently limited to choosing one mode or the other for the entire acquired image.

There are many applications, however, such as 4D STEM or EELS introduced above, where certain regions of a detector receive a low-flux and certain other regions of the detector receive a high-flux. These regions may be referred to as, in an example, dark-field areas and bright-field disks, respectively. In these cases, as suggested above, users are forced to choose either integrating mode or counting mode and face the choice of sacrificing data quality in either the low-flux regions or high-flux regions of the acquired image.

Recent efforts to address this shortcoming have attempted to perform modified event counting by assigning an integer value to a detected event based on its total integrated, or summed, intensity. In this way, instead of counting each event, independently, as a pixel having an integer of one, each event may be represented by a pixel having a value of one, two, three, four, and the like, based on its total intensity. This approach, inherently, relies on the assumption that each particle incident on the detector deposits a similar amount of energy on the detector. Of course, appreciating that energy deposited on the detector may vary dramatically amongst different particles, via Landau noise in the case of charged particles, the assumption that each particle incident on the detector deposits a similar amount of energy on the detector is rendered moot. In particular, for low-flux particles, where at least a portion of the events may be discretized, the inherent variability in energy differences between particles may overwhelm any assigned differences between events. At high-flux, this variability is statistically diminished by averaging. However, at relatively low-flux (where at least some individual events can be discriminated), this inherent variability overwhelms differences between "blobs" representing one, two, three, etc., detected particles. Additionally, though high-flux reduces statistical variability in event energies, such approach cannot be applied at certain high-fluxes readily present in certain applications. As a result, in attempting to apply a form of event counting to an entire image, high-resolution detail may be ignored in favor an integer representing a single pixel.

In order to address the above-described deficiencies of previous techniques, the present disclosure provides an apparatus and method(s) implementing a high dynamic range (HDR) counting method that incorporates integrating mode and counting mode for acquired images.

Figure 2A:
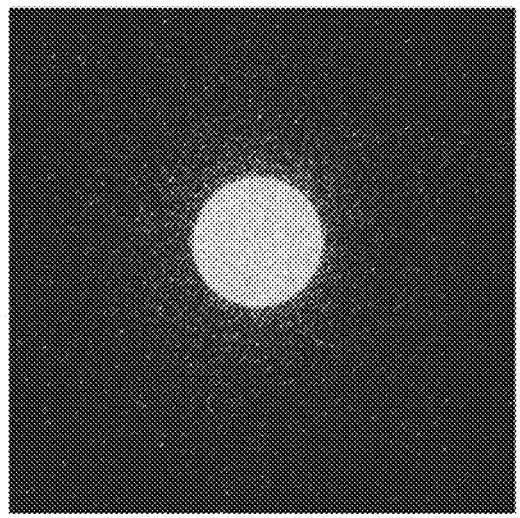
FIG. 2A is an illustration of an image acquired from a detector, according to an exemplary embodiment of the present disclosure.
Figure 2B:
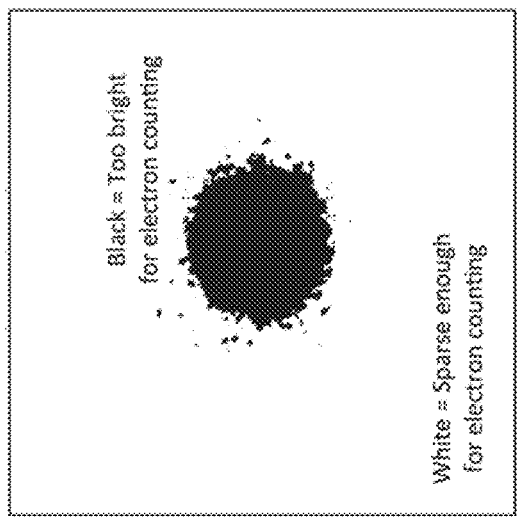
FIG. 2B is an illustration of a sparsity map generated as part of an implementation of an aspect of a method for generating an image by high dynamic range counting, according to an exemplary embodiment of the present disclosure.

According to an embodiment, and at a high-level, the present disclosure provides a method by which sparse regions of an image acquired from a pixelated detector may be processed differently from dense regions of the acquired image. To this end, the acquired image may be an image acquired by 4D STEM, as in FIG. 2A. A bright-field disk at the center of the image may be surrounded by a dark-field area on the perimeter. As in FIG. 2A, it can be appreciated that areas in the middle of the image are visibly brighter than areas on the edge of the image. Traditionally, a user may be required, at this stage, to select whether to proceed in electron counting mode (a.k.a., event counting mode, counting mode) or to proceed in integrating mode. In order to preserve information in the bright-field disk, the user may select integrating mode. Such a selection, however, inherently sacrifices information within the dark-field area, as described above. Accordingly, these differing areas must be processed differently in order to arrive at an accurate approximation of the signal detected at each pixel therein. With reference to FIG. 2B, a sparsity map may be calculated for each acquired image, the sparsity map including a mask corresponding to regions of the acquired image where the number of primary electrons per pixel, for instance, are low enough to allow for processing via counting mode. In an example, the sparsity map may include a binary mask indicating regions of high-flux and regions of low-flux, though it can be appreciated that other flux regions may exists and, accordingly, the sparsity map may include a mask with varied sparsity map values. Application of the sparsity map allows regions of the bright-field disk, where sufficient primary electrons per pixel exist to minimize Landau noise, to be processed by integrating mode. Regions of FIG. 2B that are white may be processed by counting mode while regions of FIG. 2B that are black may be processed by integrating mode. By this method, the calculated sparsity mask may be applied, each counted electron within the sparse region being scaled to an average signal deposited by a primary electron in integrating mode or other statistical measure (e.g., median, mode, and the like) related to pixel intensity per primary electron. It can be appreciated that the opposite scaling may be considered. The result is, as in FIG. 2C, a single frame where the dark-field area uses counting mode to boost SNR and the bright-field disk uses integrating mode to accommodate the necessary dynamic range.

Figure 2C:
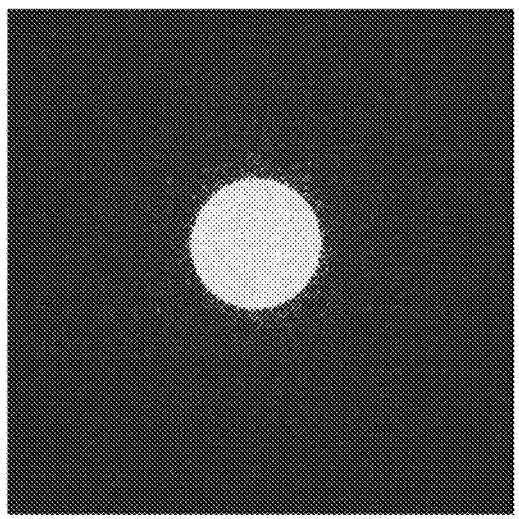
FIG. 2C is an illustration of a final image generated as part of an implementation of an aspect of a method for generating an image by high dynamic range counting, according to an exemplary embodiment of the present disclosure.

The high-level introduction of FIG. 2A through FIG. 2C will now be described in greater detail in the remaining Figures.

Figure 3A:
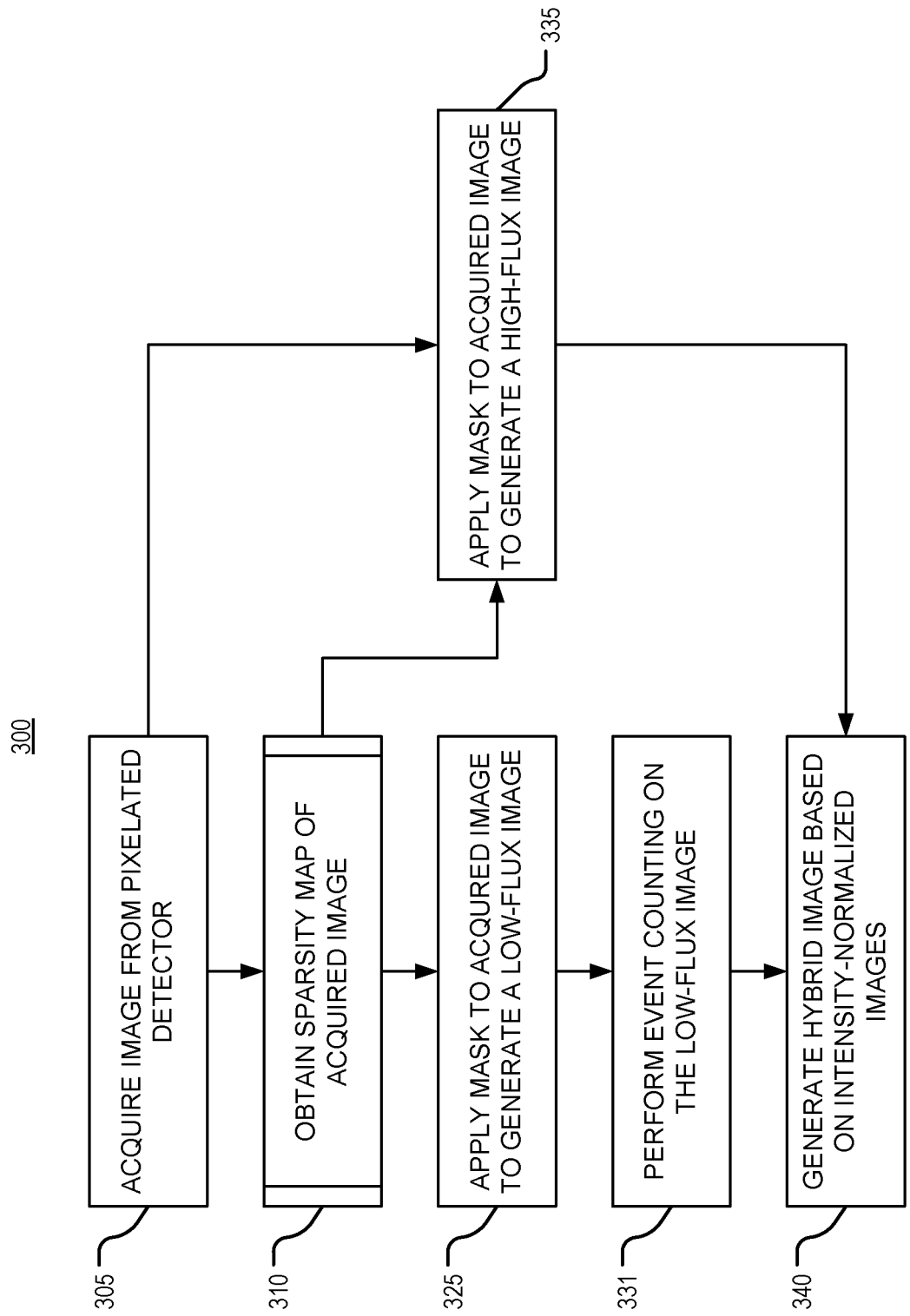
FIG. 3A is a flow diagram of a method for generating an image by high dynamic range counting, according to an exemplary embodiment of the present disclosure.

For instance, FIG. 3A is a flow diagram of a method for generating a hybrid image by high dynamic range counting, according to an exemplary embodiment of the present disclosure.

According to an embodiment, a method 300, as described in FIG. 3A, requires use of a detector with sufficient sensitivity to detect single charged particles (e.g., electrons, protons, ions) or photons incident on the detector. The detector may be, for example, a pixelated detector. Such a pixelated detector may output a single image or a stream of multiple images. Each image of the stream of multiple images may be referred to, herein, as a frame. In addition to that which is described in the present disclosure with reference to, at least, FIG. 3A, a variety of corrections and/or frame modifications may be made. Though the method 300 of the present disclosure may be implemented independently of or in coordination with these corrections and/or frame modifications, such corrections and/or frame modifications may include dark/offset correction, gain correction, background subtraction, linearity correction, and the like.

With reference now to FIG. 3A, an image processing control device, such as that described with reference to FIG. 10, may be configured to implement method 300. First, at step 305 of method 300, an image, or frame, may be acquired from a pixelated detector. The pixelated detector may acquire the image in integrating mode.

The image acquired at step 305 of method 300 may be provided, simultaneously, to step 335 of method 300 and sub process 310 of method 300. At sub process 310 of method 300, a sparsity map, which describes which regions of the acquired image that may be processed by counting mode, or may remain in integrating mode, may be obtained. Sub process 310 of method 300 will be described in greater detail with reference to subsequent Figures but generally includes acquisition of a user-defined sparsity map based on the acquired image, wherein, for instance, a user manually selects sparse regions of an image, or a sparsity map calculated by automated procedure based on the acquired image, the sparse regions being automatically identified by image analysis.

Based on the sparsity map obtained at sub process 310 of method 300, a mask, also referred to herein as a flux mask, may be applied to the acquired image, at step 325 of method 300 and at step 335 of method 300, to generate a low-flux image and a high-flux image, respectively.

Next, appreciating that the acquired image is acquired by integrating mode, event analysis may be performed on the low-flux image at sub process 330 of method 300. Event analysis includes, for the low-flux image, evaluation by electron counting mode, or counting mode.

At step 340 of method 300, intensities of the low-flux image, representing counting mode analysis, and the high-flux image, representing integrating mode analysis, may be scaled relative to one another to ensure a statistical metric describing total intensity per detected event, or particle, is equivalent between the low-flux image and the high-flux image. The statistical metric may be a mean, a median, a mode, and the like, as appropriate. The scaling may include multiplying the intensity of the low-flux image by a constant and/or multiplying the intensity of the high-flux image by a constant. The constant may be a normalization constant. After intensity-normalization between the low-flux image and the high-flux image, the two images may be merged, at step 340 of method 300 to generate a hybrid image that may be used for subsequent image processing. Such subsequent image processing may be, in an example, center of mass processing, edge slope processing, and the like, as will be described in more detail with reference to FIG. 7A through FIG. 9B.

While the flow diagram of FIG. 3A is described as a set of linearly-progressing steps, it can be appreciated that certain steps of method 300 may be performed in a different progression. For instance, with reference to FIG. 3B, electron counting mode may be implemented prior to application of a sparsity map-based flux mask.

As in FIG. 3A, an image processing control device, such as that described with reference to FIG. 10, may be configured to implement method 300 of FIG. 3B. First, at step 305 of method 300, an image, or frame, may be acquired from a pixelated detector. The pixelated detector may acquire the image in integrating mode.

The image acquired at step 305 of method 300 may be provided, simultaneously, to step 331 of method 300, step 335 of method 300, and sub process 310 of method 300. At step 331 of method 300, electron counting mode may be performed on the acquired image. In this way, counting mode may be applied to as-of-yet-unknown low-flux regions and high-flux regions of the acquired image. At sub process 310 of method 300, a sparsity map, describing which regions of the acquired image may be processed by counting mode, or may remain in integrating mode, may be obtained. Sub process 310 of method 300 will be described in greater detail with reference to subsequent Figures but generally includes acquisition of a user-defined sparsity map based on the acquired image, wherein, for instance, a user manually selects sparse regions of an image, or a sparsity map calculated by automated procedure based on the acquired image, the sparse regions being automatically identified by image analysis.

Based on the sparsity map obtained at sub process 310 of method 300, a flux mask may be applied to the counting mode-version of the acquired image at step 325 of method 300 and to the integrating mode-version of the acquired image at step 335 of method 300. In applying the flux mask to the counting mode-version of the acquired image at step 325 of method 300, only regions of the acquired image indicated as low-flux regions will be preserved. Therefore, in applying the flux mask to the counting mode-version of the acquired image, a low-flux image may be generated. In an example, this may correspond to a dark-field area. Similarly, in applying the flux mask to the integrating mode-version of the acquired image at step 335 of method 300, only regions of the acquired image indicated as high-flux regions will be preserved. Therefore, in applying the flux mask to the integrating mode-version of the acquired image, a high-flux image may be generated. In an example, this may correspond to a bright-field disk.

At step 340 of method 300, intensities of the low-flux image and the high-flux image may be scaled relative to one another to ensure a statistical metric describing total intensity per detected event, or particle, is equivalent between the low-flux image and the high-flux image. The statistical metric may be a mean, a median, a mode, and the like, as appropriate. The scaling may include multiplying the intensity of the low-flux image by a constant and/or multiplying the intensity of the high-flux image by a constant. The constant may be a normalization constant. After intensity-normalization between the low-flux image and the high-flux image, the two images may be merged, at step 340 of method 300 to generate a hybrid image that may be used for subsequent image processing. Such subsequent image processing may be, in an example, center of mass processing, edge slope processing, and the like, as will be described in more detail with reference to FIG. 7A through FIG. 9B.

Figure 3B:
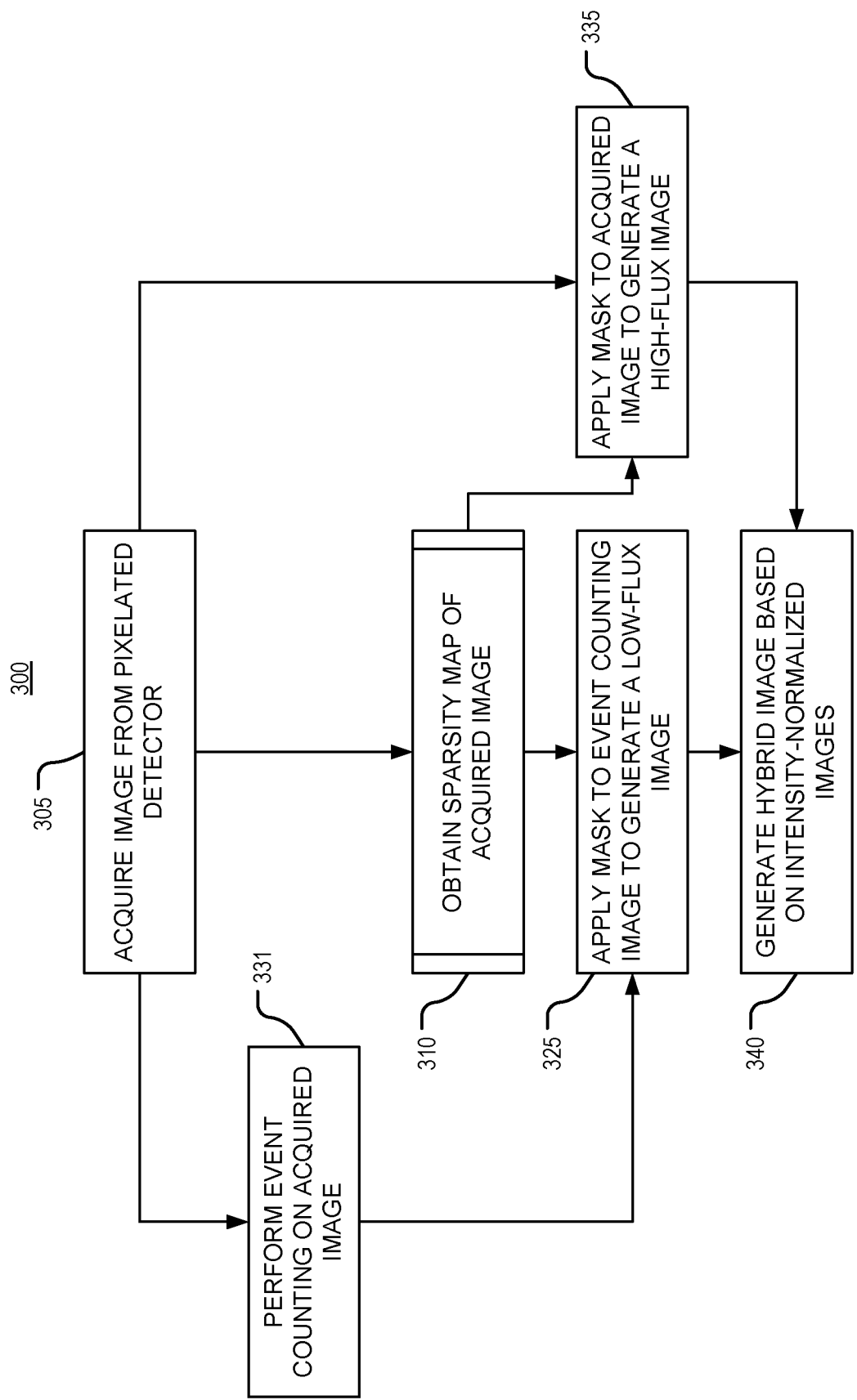
FIG. 3B is a flow diagram of a method for generating an image by high dynamic range counting, according to an exemplary embodiment of the present disclosure.
Figure 4:
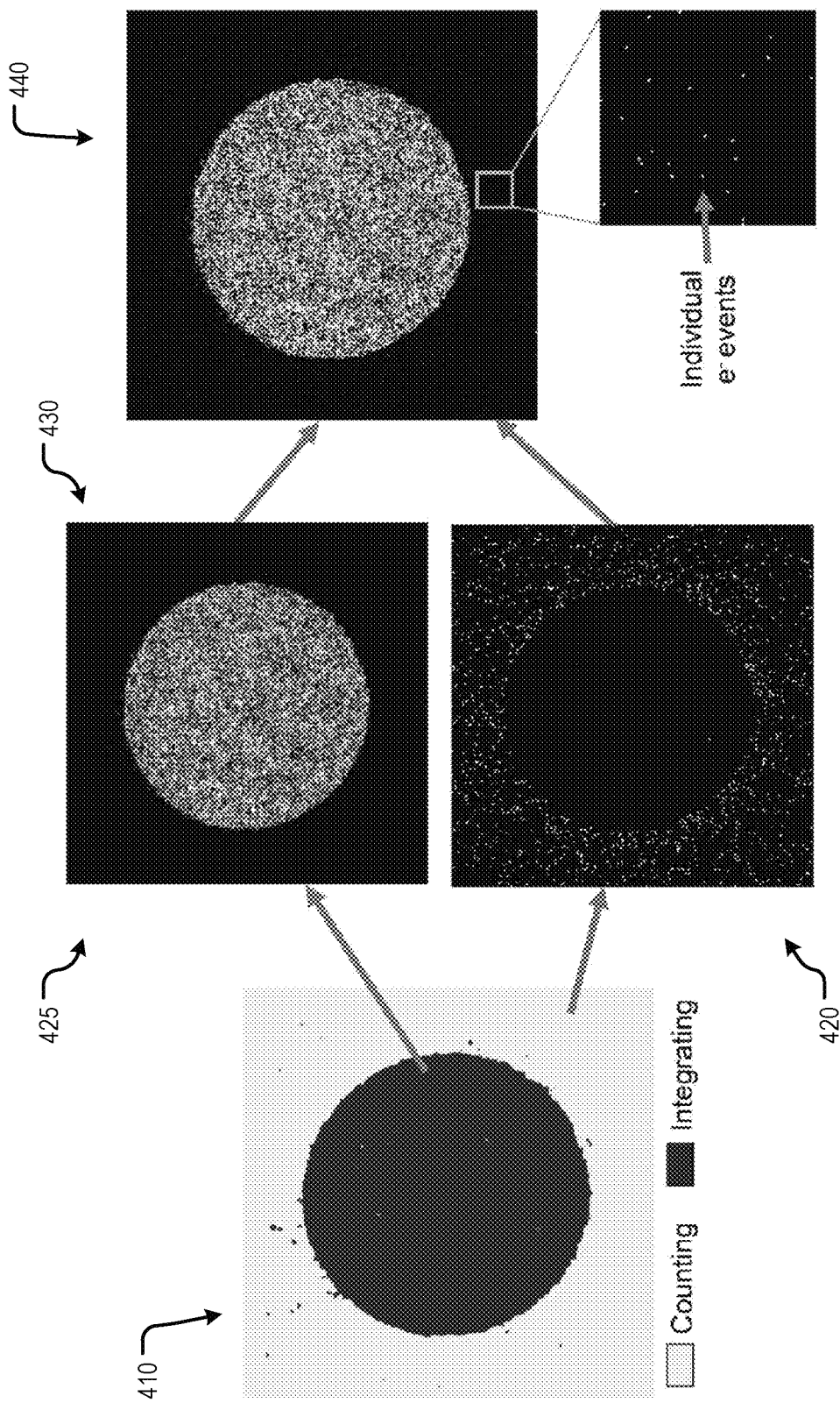
FIG. 4 is an illustration of a flow diagram of a method for generating an image by high dynamic range counting, according to an exemplary embodiment of the present disclosure.

FIG. 4 provides an illustration of the flow diagrams of each of FIG. 3A and FIG. 3B. FIG. 4 includes, in particular, application of the sparsity map to generate a low-flux image and a high-flux image. An image of a sparsity map 410, including a bright-field disk in a central area of the image and a dark-field area around a periphery thereof, illustrates a flux mask that may be envisaged. After applying the flux mask based on the sparsity map 410 to an acquired image, or to a counting-mode version of the acquired image and to an integrating-mode version of the acquired image, a high-flux masked frame 425 may be generated and a low-flux masked frame 420 may be generated and, in an example, evaluated 430 by counting mode. As described in FIG. 3A and FIG. 3B, resulting intensities of the high-flux image and the low-flux image may be normalized and merged to generate a hybrid image 440. It can be appreciated, in view of the magnified image corresponding to the hybrid image 440, that individual electron events in addition to integrations of high-flux events may be captured in the hybrid image 440.

As discussed above, the sparsity map may be a predetermined sparsity map based on user-defined input and the like, or the sparsity map may be a calculated sparsity map determined by automated procedures based on the acquired image. Accordingly, FIG. 5A through FIG. 5D describe embodiments of FIG. 3A and FIG. 3B wherein the sparsity map is determined by exemplary methods.

Figure 5A:
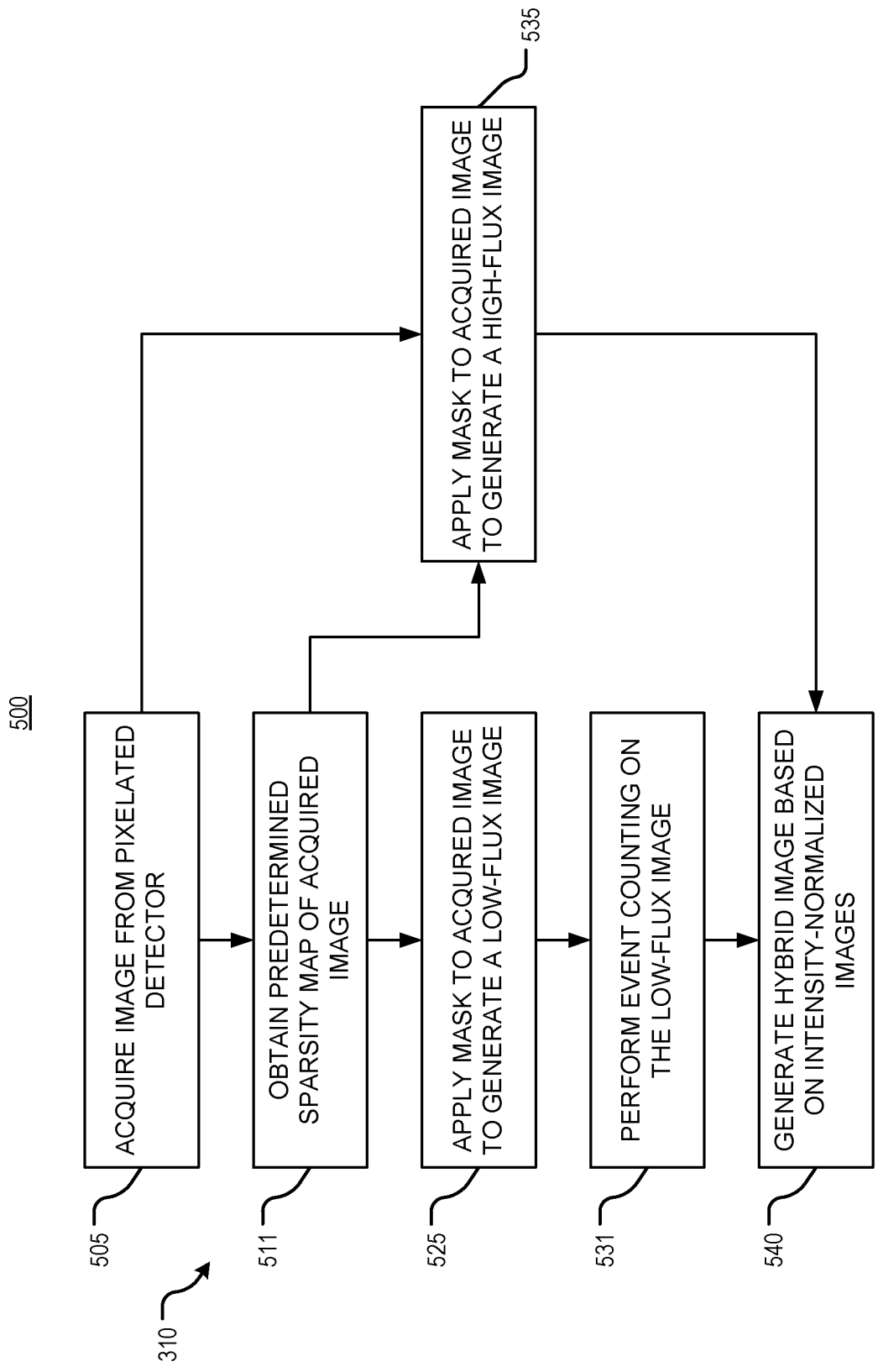
FIG. 5A is a flow diagram of a method for generating an image by high dynamic range counting, according to an exemplary embodiment of the present disclosure.

With reference now to FIG. 5A, an image processing control device, such as that described with reference to FIG. 10, may be configured to implement method 500. First, at step 505 of method 500, an image, or frame, may be acquired from a pixelated detector. The pixelated detector may acquire the image in integrating mode.

The image acquired at step 505 of method 500 may be provided, simultaneously, to step 535 of method 500 and step 511 of method 500. At step 511 of method 500, which is an example of sub process 310 of method 300, a sparsity map, which describes which regions of the acquired image that may be processed by counting mode, or may remain in integrating mode, may be obtained. In an example, the sparsity map obtained at step 511 of method 500 may be a predetermined sparsity map. The predetermined sparsity map may be based on previous iterations of similar frames and/or may be based on user-defined input. For instance, a user may define and select regions of the acquired image that may be considered low-flux regions. A flux mask may be generated based on the user-defined input regarding the low-flux regions and, accordingly, the flux mask may include high-flux regions, as shown in FIG. 4. In another instance, the flux mask may be acquired from a reference database of flux masks. The flux masks within the reference database may be previously user-defined flux masks and/or may be previously automatically calculated flux masks with unique imaging subject parameters, procedure parameters, and the like. The reference database may serve to, in an instance where a present imaging subject is similar to a previous imaging subject, allow for rapid determination of a flux mask.

Based on the predetermined sparsity map obtained at step 511 of method 500, the flux mask may be applied to the acquired image to generate, at step 525 of method 500, a low-flux image, and to generate, at step 535 of method 500, a high-flux image.

Next, appreciating that the acquired image is acquired by integrating mode, event analysis may be performed on the low-flux image at step 531 of method 500. Event analysis includes, for the low-flux image, evaluation by electron counting mode, or counting mode.

At step 540 of method 500, intensities of the low-flux image, representing counting mode analysis, and the high-flux image, representing integrating mode analysis, may be scaled relative to one another to ensure a statistical metric describing total intensity per detected event, or particle, is equivalent between the low-flux image and the high-flux image. The statistical metric may be a mean, a median, a mode, and the like, as appropriate. The scaling may include multiplying the intensity of the low-flux image by a constant and/or multiplying the intensity of the high-flux image by a constant. The constant may be a normalization constant. After intensity-normalization between the low-flux image and the high-flux image, the two images may be merged, at step 540 of method 500, to generate a hybrid image that may be used for subsequent image processing. Such subsequent image processing may be, in an example, center of mass processing, edge slope processing, and the like, as will be described in more detail with reference to FIG. 7A through FIG. 9B.

Similarly, and with reference now to FIG. 5B, the flow diagram of FIG. 3B will be described in view of an exemplary method of obtaining the sparsity map. As in FIG. 3B, FIG. 5B describes implementation of electron counting mode prior to application of a sparsity map-based flux mask.

Moreover, as in FIG. 3B, an image processing control device, such as that described with reference to FIG. 10, may be configured to implement method 500 of FIG. 5B. First, at step 505 of method 500, an image, or frame, may be acquired from a pixelated detector. The pixelated detector may acquire the image in integrating mode.

The image acquired at step 505 of method 500 may be provided, simultaneously, to step 531 of method 500, step 535 of method 500, and step 511 of method 500. At step 531 of method 500, electron counting mode, or event counting mode, may be performed on the acquired image. In this way, counting mode may be applied to as-of-yet-unknown low-flux regions and high-flux regions of the acquired image. At step 511 of method 500, a sparsity map, describing which regions of the acquired image may be processed by counting mode, or may remain in integrating mode, may be obtained. In an example, the sparsity map obtained at step 511 of method 500 may be a predetermined sparsity map. The predetermined sparsity map may be based on previous iterations of similar frames and/or may be based on user-defined input. For instance, a user may define and select regions of the acquired image that may be considered low-flux regions. A flux mask may be generated based on the user-defined input regarding the low-flux regions and, accordingly, the flux mask may include high-flux regions, as shown in FIG. 4. In another instance, the flux mask may be acquired from a reference database of flux masks. The flux masks within the reference database may be previously user-defined flux masks and/or may be previously automatically calculated flux masks with unique imaging subject parameters, procedure parameters, and the like. The reference database may serve to, in an instance where a present imaging subject is similar to a previous imaging subject, allow for rapid determination of a flux mask.

Based on the predetermined sparsity map obtained at step 510 of method 500, the flux mask may be applied to the counting mode-version of the acquired image at step 525 of method 500 and to the integrating mode-version of the acquired image at step 535 of method 500. In applying the flux mask to the counting mode-version of the acquired image at step 525 of method 500, only regions of the acquired image indicated as low-flux regions will be preserved. Therefore, in applying the flux mask to the counting mode-version of the acquired image, a low-flux image may be generated. In an example, this may correspond to a dark-field area. Similarly, in applying the flux mask to the integrating mode-version of the acquired image at step 535 of method 500, only regions of the acquired image indicated as high-flux regions will be preserved. Therefore, in applying the flux mask to the integrating mode-version of the acquired image, a high-flux image may be generated. In an example, this may correspond to a bright-filed disk.

At step 540 of method 500, intensities of the low-flux image and the high-flux image may be scaled relative to one another to ensure a statistical metric describing total intensity per detected event, or particle, is equivalent between the low-flux image and the high-flux image. The statistical metric may be a mean, a median, a mode, and the like, as appropriate. The scaling may include multiplying the intensity of the low-flux image by a constant and/or multiplying the intensity of the high-flux image by a constant. The constant may be a normalization constant. After intensity-normalization between the low-flux image and the high-flux image, the two images may be merged, at step 540 of method 500, to generate a hybrid image that may be used for subsequent image processing. Such subsequent image processing may be, in an example, center of mass processing, edge slope processing, and the like, as will be described in more detail with reference to FIG. 7A through FIG. 9B.

Figure 5B:
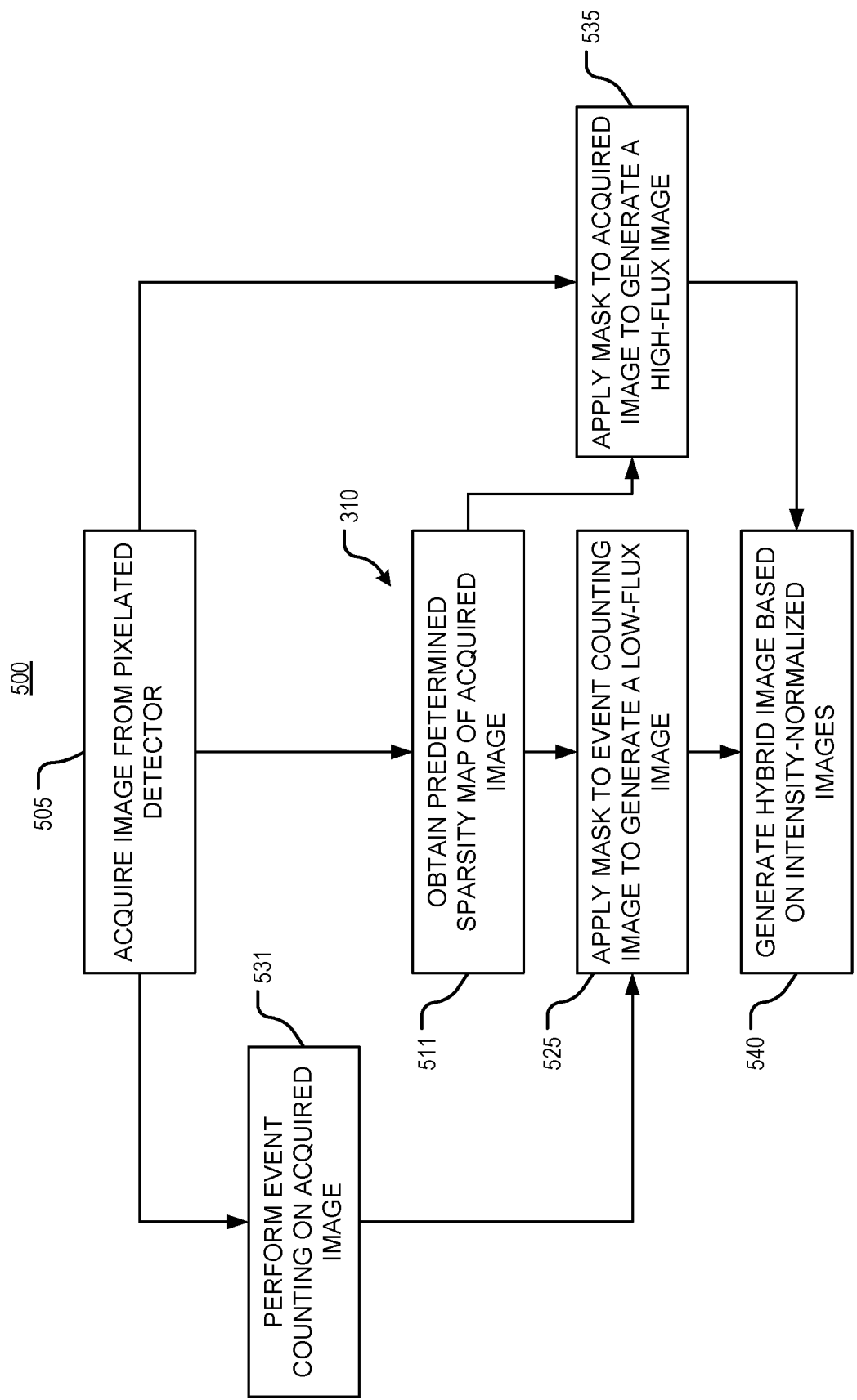
FIG. 5B is a flow diagram of a method for generating an image by high dynamic range counting, according to an exemplary embodiment of the present disclosure.

The above flow diagrams of FIG. 5A and FIG. 5B describe embodiments wherein the sparsity map is a predetermined sparsity map based on user-defined inputs. As discussed above, and in an embodiment, the sparsity map may also be a calculated sparsity map determined by automated procedures based on the acquired image. Accordingly, FIG. 5C and FIG. 5D describe embodiments of FIG. 3B wherein the sparsity map is automatically calculated based on information within the acquired image.

Figure 5C:
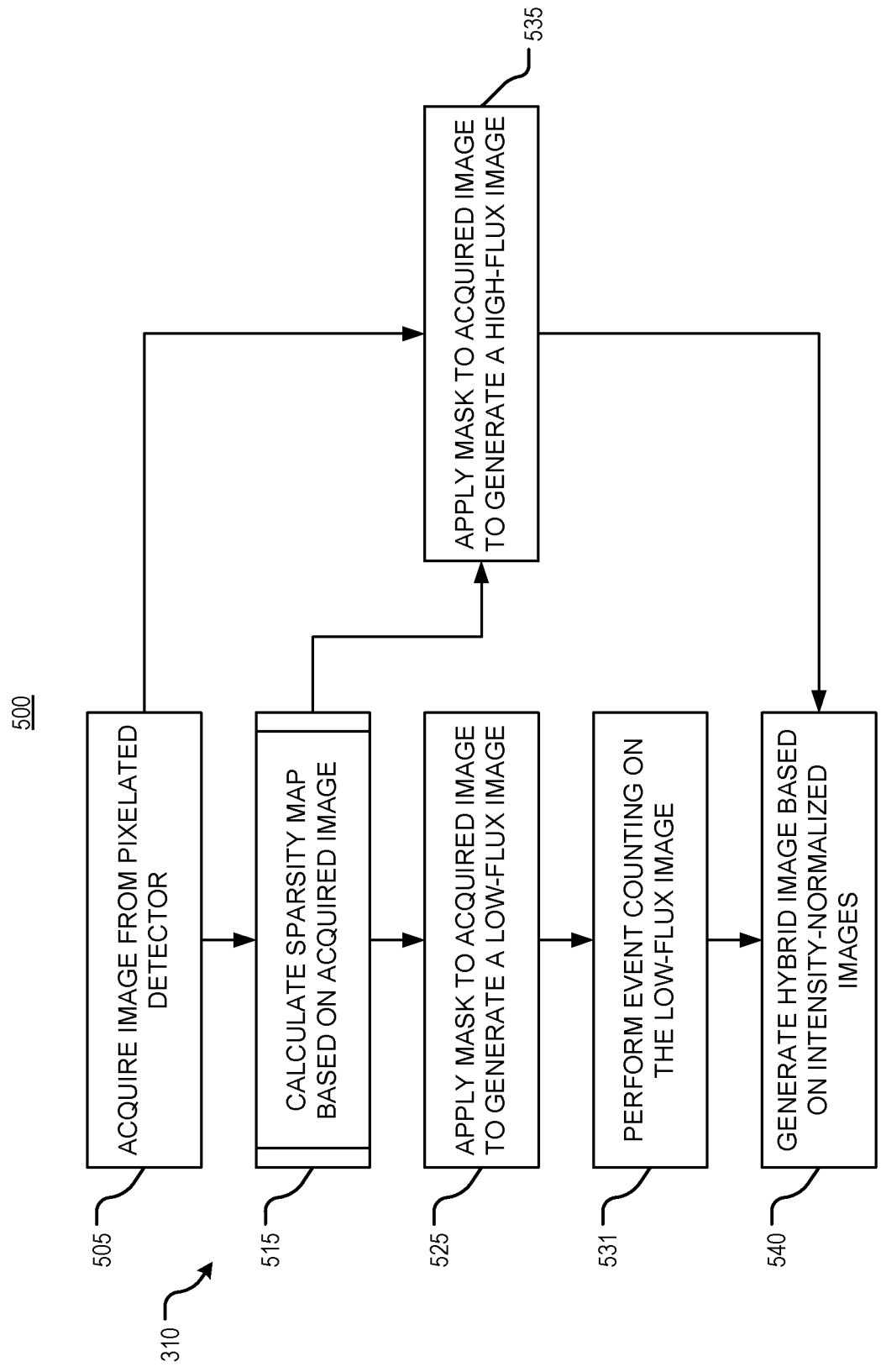
FIG. 5C is a flow diagram of a method for generating an image by high dynamic range counting, according to an exemplary embodiment of the present disclosure.

With reference now to FIG. 5C, an image processing control device, such as that described with reference to FIG. 10, may be configured to implement method 500. First, at step 505 of method 500, an image, or frame, may be acquired from a pixelated detector. The pixelated detector may acquire the image in integrating mode.

The image acquired at step 505 of method 500 may be provided, simultaneously, to step 535 of method 500 and sub process 515 of method 500. At sub process 515 of method 500, which is an example of sub process 310 of method 300, a sparsity map, which describes which regions of the acquired image that may be processed by counting mode, or may remain in integrating mode, may be calculated. In an example, the sparsity map calculated at sub process 515 of method 500 may be calculated based on the acquired image. The sparsity map may be calculated for each acquired image and may include a mask corresponding to regions of the acquired image where the number of primary electrons per pixel, for instance, is low enough to allow for processing via counting mode. The mask may be referred to as a mask or a flux mask, as previously described. This approach allows regions of the bright-field disk, where sufficient primary electrons per pixel exist to minimize Landau noise, to be preserved, as originally-processed, in integrating mode. A more detailed description of sub process 515 of method 500 will be described with respect to FIG. 6A and FIG. 6B.

Based on the sparsity map calculated at sub process 515 of method 500, a flux mask may be applied to the acquired image to generate, at step 525 of method 500, a low-flux image, and to generate, at step 535 of method 500, a high-flux image.

Next, appreciating that the acquired image is acquired by integrating mode, event analysis may be performed on the low-flux image at step 531 of method 500. Event analysis includes, for the low-flux image, evaluation by electron counting mode, or counting mode.

At step 540 of method 500, intensities of the low-flux image, representing counting mode analysis, and the high-flux image, representing integrating mode analysis, may be scaled relative to one another to ensure a statistical metric describing total intensity per detected event, or particle, is equivalent between the low-flux image and the high-flux image. The statistical metric may be a mean, a median, a mode, and the like, as appropriate. The scaling may include multiplying the intensity of the low-flux image by a constant and/or multiplying the intensity of the high-flux image by a constant. The constant may be a normalization constant. After intensity-normalization between the low-flux image and the high-flux image, the two images may be merged, at step 540 of method 500, to generate a hybrid image that may be used for subsequent image processing. Such subsequent image processing may be, in an example, center of mass processing, edge slope processing, and the like, as will be described in more detail with reference to FIG. 7A through FIG. 9B.

Figure 5D:
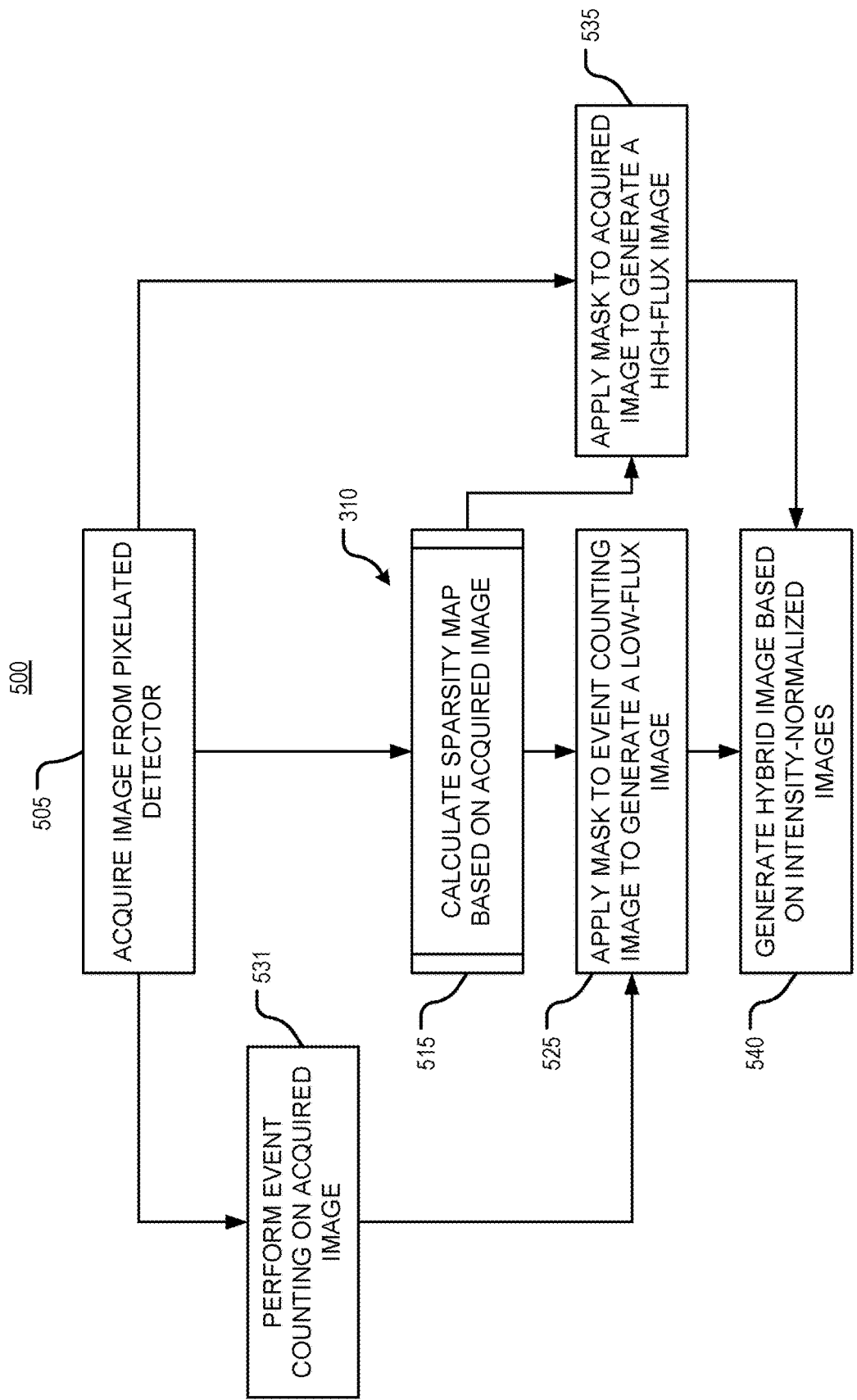
FIG. 5D is a flow diagram of a method for generating an image by high dynamic range counting, according to an exemplary embodiment of the present disclosure.

Similarly, and with reference now to FIG. 5D, the flow diagram of FIG. 3B will be described in view of an exemplary method of obtaining the sparsity map. As in FIG. 3B, FIG. 5D describes implementation of electron counting mode prior to application of a sparsity map-based flux mask. An image processing control device, such as that described with reference to FIG. 10, may be configured to implement method 500 of FIG. 5D. First, at step 505 of method 500, an image, or frame, may be acquired from a pixelated detector. The pixelated detector may acquire the image in integrating mode.

The image acquired at step 505 of method 500 may be provided, simultaneously, to step 531 of method 500, step 535 of method 500, and sub process 515 of method 500. At step 531 of method 500, electron counting mode, or event counting mode, may be performed on the acquired image. In this way, counting mode may be applied to as-of-yet-unknown low-flux regions and high-flux regions of the acquired image. At sub process 515 of method 500, which is an example of sub process 310 of method 300, a sparsity map, describing which regions of the acquired image may be processed by counting mode, or may remain in integrating mode, may be calculated. In an example, the sparsity map calculated at sub process 515 of method 500 may be calculated based on the acquired image. The sparsity map may be calculated for each acquired image and may include a mask corresponding to regions of the acquired image where the number of primary electrons per pixel, for instance, is low enough to allow for processing via counting mode. The mask may be referred to as a mask or a flux mask, as previously described. This approach allows regions of the bright-field disk, where sufficient primary electrons per pixel exist to minimize Landau noise, to be preserved, as originally-processed, in integrating mode. A more detailed description of sub process 515 of method 500 will be described with respect to FIG. 6A and FIG. 6B.

Based on the sparsity map calculated at sub process 515 of method 500, a flux mask may be applied to the counting mode-version of the acquired image at step 525 of method 500 and to the integrating mode-version of the acquired image at step 535 of method 500. In applying the flux mask to the counting mode-version of the acquired image at step 525 of method 500, only regions of the acquired image indicated as low-flux regions will be preserved. Therefore, in applying the flux mask to the counting mode-version of the acquired image, a low-flux image may be generated. In an example, this may correspond to a dark-field area. Similarly, in applying the flux mask to the integrating mode-version of the acquired image at step 535 of method 500, only regions of the acquired image indicated as high-flux regions will be preserved. Therefore, in applying the flux mask to the integrating mode-version of the acquired image, a high-flux image may be generated. In an example, this may correspond to a bright-field disk.

At step 540 of method 500, intensities of the low-flux image and the high-flux image may be scaled relative to one another to ensure a statistical metric describing total intensity per detected event, or particle, is equivalent between the low-flux image and the high-flux image. The statistical metric may be a mean, a median, a mode, and the like, as appropriate. The scaling may include multiplying the intensity of the low-flux image by a constant and/or multiplying the intensity of the high-flux image by a constant. The constant may be a normalization constant. After intensity-normalization between the low-flux image and the high-flux image, the two images may be merged, at step 540 of method 500, to generate a hybrid image that may be used for subsequent image processing. Such subsequent image processing may be, in an example, center of mass processing, edge slope processing, and the like, as will be described in more detail with reference to FIG. 7A through FIG. 9B.

The sparsity map calculated at sub process 515 of method 500 in FIG. 5C and FIG. 5D will now be described in greater detail with reference to FIG. 6A through FIG. 6C. Beginning with FIG. 6A, it can be appreciated that sub process 515 of method 500 operates in order to find regions of an acquired image where a density of detected events is at a level below a threshold that may bar electron event counting from being implemented.

Generally, automated calculation of a sparsity map, according to sub process 515 of method 500, is based on assigning a value, or sparsity map value, to each pixel of a sparsity map. To this end, each pixel of the sparsity map may reflect an evaluation of a value of a corresponding pixel of an acquired image relative to a pixel value threshold and to pixel values of a group of pixels including the corresponding pixel. The number of pixels in each group of pixels that includes the corresponding pixel may be user-defined or may be dynamic according to parameters of the acquired image. The pixel value threshold may define, for instance, an intensity of a pixel in the acquired image above/below which a flux-region determination can be made. In an embodiment, the pixel value threshold may be dependent upon a specific region of an acquired image. In an embodiment, the pixel value threshold may be predetermined (i.e., user-defined) or calculated, and it may be the same pixel value threshold for each pixel of a sparsity map or it may be dynamically-determined for different pixels of the sparsity map.

With reference to FIG. 6A, at step 616 of sub process 515, a number of pixels in each group of pixels (or neighborhood) may be defined for an image acquired at step 505 of method 500. The size of the group of pixels may be determined according to, for instance, desired granularity of a sparsity map determination. The group of pixels may be between 40 pixels and 160 pixels in size, in an example. The group of pixels may be rectangular, circular, pyramidal, and the like, based on task-specific needs.

In an embodiment, the group of pixels may be defined relative to a corresponding pixel, or a seed pixel. For instance, the group of pixels may be circular, including the seed pixel and any pixel within a 7 pixel radius thereof. Therefore, if the seed pixel moves one pixel position to the right, the group of pixels, correspondingly, is shifted one pixel position to the right. Thus, a moving window provides context to calculation of a sparsity map value for each seed pixel of an acquired image.

Having defined the size of each group of pixels at step 616 of sub process 515, a sparsity map value for the seed pixel may be determined at step 617 of sub process 515. For instance, a pixel value of the seed pixel and pixel values of each of the remaining members of the group of pixels may be evaluated relative to a pixel value threshold. A sparsity map value of the seed pixel may be determined based on a ratio calculated from the evaluation of pixel values relative of the group of pixels to the pixel value threshold.

If the ratio indicates, for instance, a majority of pixel values within the group of pixels are above the pixel value threshold, the sparsity map value of the seed pixel may be defined as a value indicating high flux. In an example, the sparsity map values may be binary values and, when the ratio indicates the majority of pixel values within the group of pixels are above the pixel value threshold, a value of 1 may be assigned to the seed pixel. If, alternatively, the ratio indicates a minority of pixel values within the group of pixels are above the pixel value threshold, the sparsity map value of the seed pixel may be defined as a value indicating low flux. In an example, the sparsity map values may be binary values and, when the ratio indicates the minority of pixel values within the group of pixels are above the pixel value threshold, a value of 0 may be assigned to the seed pixel. In an embodiment, the ratio may be based on a number of pixels below the pixel value threshold relative to the total number of pixels within the group of pixels. Of course, any other ratio may be imagined and implemented, as appropriate. In an alternative embodiment, if a pixel value of the seed pixel and the ratio, for instance, is equal to the pixel value threshold, the seed pixel may be categorized as low-flux or high-flux, depending on a particular implementation of the invention.

In an embodiment, the sparsity map values may be analog and may include a range of values. In this way, the sparsity map value may reflect a level of confidence that a seed pixel is appropriately assigned during ratio calculation. For instance, and appreciating the ratio may indicate a level of confidence in an assignment of a seed pixel, wherein a ratio of 0.1 and 10 may indicate confidence while a ratio of 1 may indicate little confidence, when the ratio indicates a slim majority of pixel pixels within the group of pixels are above the pixel value threshold, a value of 6, on a scale of 1 10, may be assigned to the seed pixel. Accordingly, as opposed to assigning the seed pixel as being in a low-flux region or a high-flux region, the seed pixel may be assigned as being in a mid-flux region or other flux region between a low-flux region and a high-flux region. Being assigned to a mid-flux region, the seed pixel may be processed according to both electron counting mode and integrating mode during image reconstruction. For instance, having a value of 6, which may indicate a slight high-flux region, the seed pixel may be processed, proportionally, such that integrating mode has slightly more influence on the final image.

It can be appreciated that the above-describe sparsity map value determination of step 617 of sub process 515 may be performed iteratively for each seed pixel within the sparsity map. In this way, each pixel of the sparsity map may be determined to be within a low-flux region or a high-flux region of the acquired image in order to be applied, at step 525 of method 500 or at step 535 of method 500, as a flux mask to the acquired image. Application of the flux mask has been described in previous Figures and, as such, a description here will be omitted for brevity.

If an expedited calculation of a sparsity map is desired, the seed pixel may be a plurality of pixels of a group of pixels, the plurality of pixels being concurrently determined and assigned a same value based on the group of pixels. To this end, and with reference to FIG. 6B, at step 616 of sub process 515, a number of pixels in each group of pixels (or neighborhood) may be defined for an image acquired at step 505 of method 500. The size of the group of pixels may be determined according to, for instance, desired granularity of a sparsity map determination. The group of pixels may be between 40 pixels and 160 pixels in size, in an example. The group of pixels may be rectangular, circular, pyramidal, and the like, based on task-specific needs. In an embodiment, the group of pixels may be defined relative to a plurality of pixels included therein.

Having defined the size of each group of pixels at step 616 of sub process 515, a sparsity map value for the plurality of pixels of the group of pixels may be determined at step 617 of sub process 515. In this way, and as a contrast to the method of FIG. 6A, the plurality of pixels within the group of pixels may be uniformly determined based on the group of pixels, thus expediting determination of sparsity map values for each pixel of the acquired image and sparsity map.

For instance, a pixel value of each of the plurality of pixels and pixel values of each of the remaining members of the group of pixels may be evaluated relative to a pixel value threshold. A sparsity map value of the plurality of pixels may be determined based on a ratio calculated from the evaluation of pixel values of the group of pixels relative to the pixel value threshold. If the ratio indicates, for instance, a majority of pixel values within the group of pixels are above the pixel value threshold, the sparsity map value of each of the plurality of pixels is defined as a value indicating high flux. In an example, the sparsity map values may be binary values and, when the ratio indicates the majority of pixel values within the group of pixels are above the pixel value threshold, a value of 1 may be assigned to the seed pixel. If, alternatively, the ratio indicates a minority of pixel values within the group of pixels are above the pixel value threshold, the sparsity map value of each of the plurality of pixels is defined as a value indicating low flux. In an embodiment, the ratio may be based on a number of pixels below the pixel value threshold relative to the total number of pixels within the group of pixels. In an example, the sparsity map values may be binary values and, when the ratio indicates the minority of pixel values within the group of pixels are above the pixel value threshold, a value of 0 may be assigned to the seed pixel. In an embodiment, the ratio may be based on a number of pixels below the pixel value threshold relative to the total number of pixels within the group of pixels. Of course, any other ratio may be imagined and implemented, as appropriate. In an alternative embodiment, if a pixel value of each of the plurality of pixels and the ratio, for instance, is equal to the pixel value threshold, the plurality of pixels may be categorized as low-flux or high-flux, depending on a particular implementation of the invention.

In an embodiment, the sparsity map values may be analog and may include a range of values. In this way, the sparsity map value may reflect a level of confidence that a seed pixel is appropriately assigned during ratio calculation. For instance, and appreciating the ratio may indicate a level of confidence in an assignment of a seed pixel, wherein a ratio of 0.1 and 10 may indicate confidence while a ratio of 1 may indicate little confidence, when the ratio indicates a slim majority of pixel pixels within the group of pixels are above the pixel value threshold, a value of 6, on a scale of 1 10, may be assigned to the seed pixel. Accordingly, as opposed to assigning the seed pixel as being in a low-flux region or a high-flux region, the seed pixel may be assigned as being in a mid-flux region or other flux region between a low-flux region and a high-flux region. Being assigned to a mid-flux region, the seed pixel may be processed according to both electron counting mode and integrating mode during image reconstruction. For instance, having a value of 6, which may indicate a slight high-flux region, the seed pixel may be processed, proportionally, such that integrating mode has slightly more influence on the final image.

In an embodiment, the plurality of pixels may be a square of 9 pixels (i.e., 3 pixels by 3 pixels) and the group of pixels thereof may be a square of 25 pixels (i.e. 5 pixels by 5 pixels), the plurality of pixels being centered within the group of pixels. In another embodiment, the plurality of pixels may be a square of 25 pixels (i.e., 5 pixels by 5 pixels) and the group of pixels thereof may be a same square of 25 pixels (i.e. 5 pixels by 5 pixels). In this way, sparsity map calculation may, for instance, proceed quickly.

It can be appreciated that the above-describe sparsity map value determination of step 617 of sub process 515 may be performed iteratively for each plurality of pixels within the sparsity map. In this way, each pixel of the sparsity map may be determined to be within a low-flux region or a high-flux region of the acquired image in order to be applied, at step 525 of method 500 or at step 535 of method 500, as a flux mask to the acquired image.

Figure 6C:
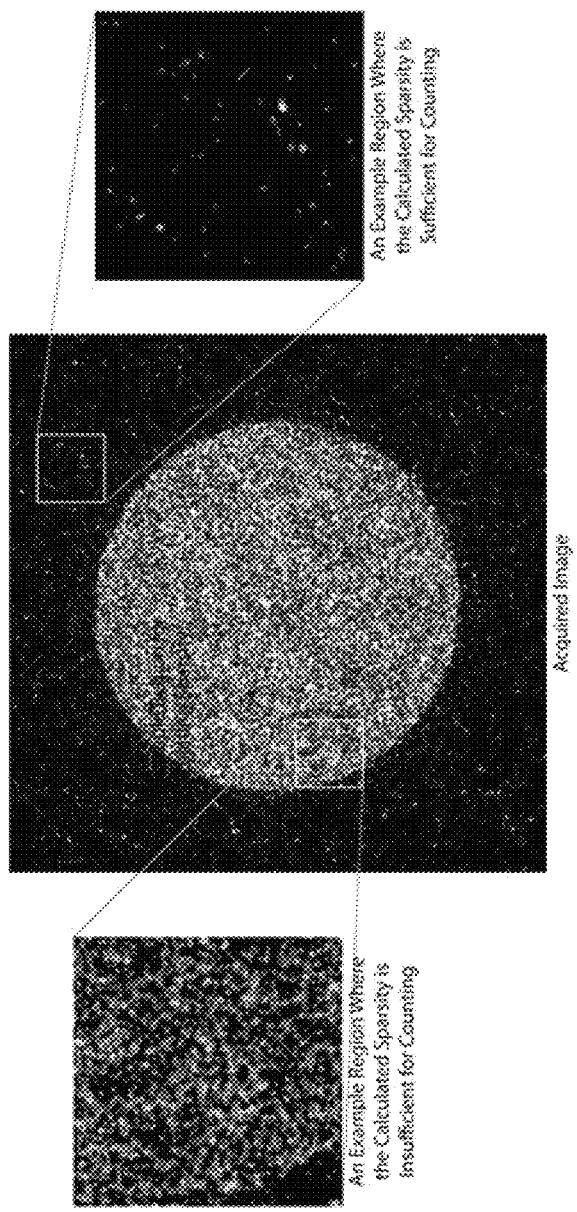
FIG. 6C is an illustration of a flow diagram of a sub process of a method for generating an image by high dynamic range counting, according to an exemplary embodiment of the present disclosure.
Figure 7B:
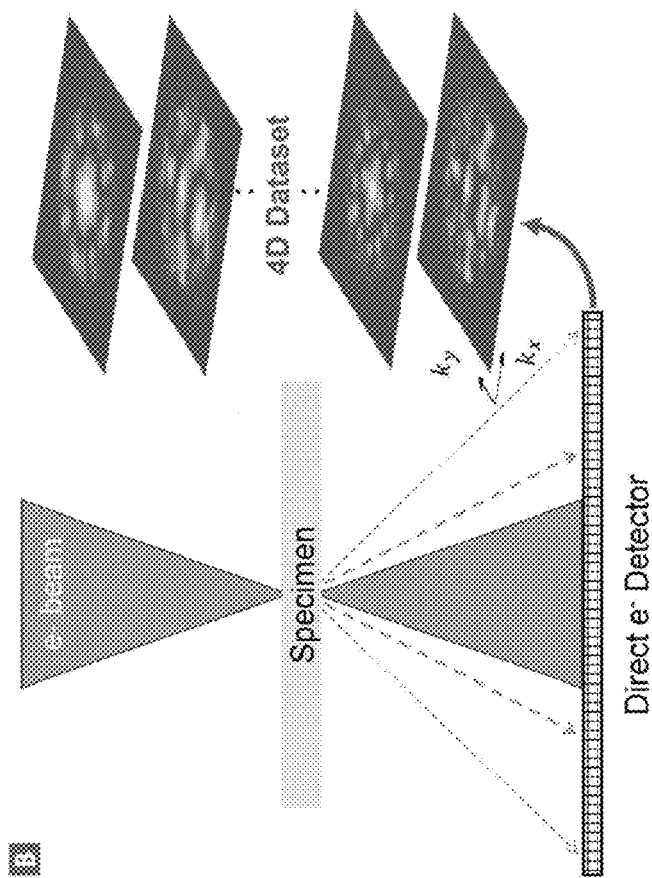
FIG. 7B is a schematic of a four-dimensional scanning transmission electron microscope, according to an exemplary embodiment of the present disclosure.
Figure 7A:
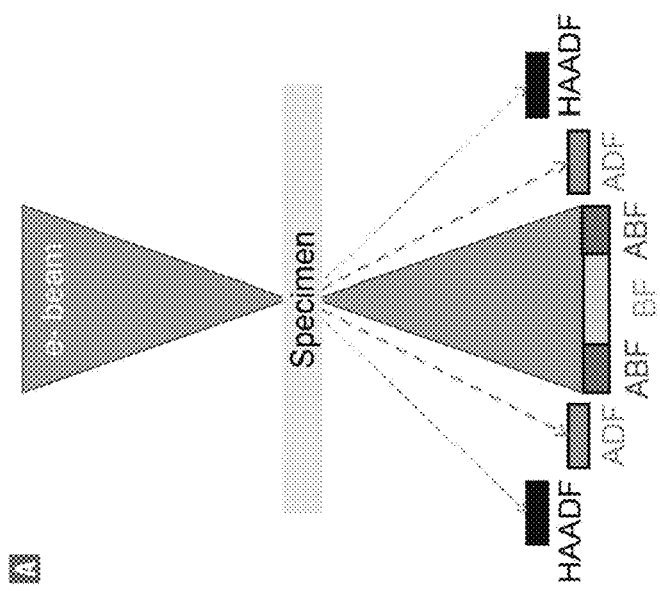
FIG. 7A is a schematic of a conventional scanning transmission electron microscope, according to an exemplary embodiment of the present disclosure.

By either method of FIG. 6A and FIG. 6B, integrating mode and electron counting mode may be applied following automatic calculation of a sparsity map, wherein certain regions are determined too bright for electron counting mode while others are determined sparse enough for electron counting mode, as shown in FIG. 6C.

According to an embodiment, and in a case where the sparsity map is automatically calculated, as above, the method of the present disclosure are configured to automatically detect sparse regions in each recorded camera frame without prior information from the user. In effect, electron counting mode may be performed without manual intervention by a user to define the position and size of low-flux regions and high-flux regions prior to implementing the method.

Regardless of which method of the present disclosure is implemented, this invention may be applicable to a variety of high-dynamic range applications, especially in electron microscopy, including 4D STEM and EELS. Accordingly, implementation of methods of the present disclosure will now be described with reference to FIG. 7A through FIG. 9B, a non-limiting exemplary implementation of the present disclosure in 4D STEM.

Scanning transmission electron microscopy (STEM) is a powerful tool for studying specimens at very high (sub-angstrom) spatial resolution. Conventional detectors for STEM, such as bright-field. (BF), annular bright-field (ABF), annular dark-field (ADF) and high angle annular dark-field (HAADF) detectors are monolithic, and form images, I(x,y), by integrating the total signal over a range of scattering angles in the diffraction plane as the focused STEM probe is rastered over a two-dimensional (2D) area of a specimen. This implementation can be appreciated with respect FIG. 7A. In contrast, detectors for 4D STEM record a pixelated, angle-resolved 2D convergent beam electron diffraction (CBED) pattern, $I(k_x,k_y)$, for every position, (x,y), in the 2D STEM raster over the specimen, yielding a 4D dataset, $I(k_x, k_y, x, y)$. This approach can be appreciated with respect to FIG. 7B. As with any diffraction pattern in transmission electron microscopy, the angles in the diffraction plane sampled in 4D STEM may be controlled by varying the microscope camera length. The size of diffraction discs in the CBED pattern may be controlled by varying the convergence angle of the STEM probe. The choice of camera length and convergence angle will depend on the types of data that one wishes to extract from the 4D STEM dataset.

The key advantage of 4D STEM compared to conventional 2D STEM imaging is that, in a single scan, one can acquire a 4D dataset that contains all possible 2D STEM images of the sample, as well as a variety of novel signals that cannot be derived from conventional 2D-STEM imaging. The speed and sensitivity of 4D data collection can be improved by employing a direct electron detector, which can either be used as a stand-alone detector or can be used alongside conventional STEM detectors. For example, a 4D STEM detector can work in conjunction with a traditional annular detector, which can record a 2D image using the signal from a region of the diffraction plane outside of that recorded by the 4D STEM detector. This flexibility allows users to upgrade their existing STEM instruments with 4D STEM capability.

The availability of high-performance electron detectors has been one of the main catalysts for the growing popularity of 4D STEM. Early efforts at recording 4D datasets consisting of CBED patterns were limited by the relatively slow readout speeds of charge-coupled devices. Recording 4D STEM data is considerably more practical when using a sensitive detector capable of millisecond or sub-millisecond readout speeds. Although 4D STEM is possible using a fast scintillator coupled camera, direct electron detectors are particularly well-suited to 4D STEM due to their high detective quantum efficiency (DQE) and high SNR compared to scintillator coupled cameras.

There are two principal types of direct electron detector that have been used for 4D STEM applications, and both types have different strengths and weaknesses. A hybrid pixel array detector (PAD) consists of an array of wide, thick pixels (e.g. 150×150×500 μm for the electron microscope pixel array detector (EMPAD) (Thermo Fisher Scientific, Waltham, Mass. USA) bump-bonded to an application specific integrated circuit. PADs typically exhibit extremely high dynamic range, due to a high saturation value per pixel, but their relatively small number of pixels limits the angular resolution of the detector and limits the ability to use the PAD as an "all-in-one" detector that can be used for other TEM imaging applications, where a large number of pixels is advantageous. In contrast, monolithic active pixel sensors (MAPS) use relatively thin pixels, which limits beam spreading within each pixel, allowing for smaller pixel sizes (e.g. 6.5×6.5 μm in the case of a DE-16 (Direct Electron, San Diego, Calif. USA)) and a correspondingly much larger number of pixels per sensor. The traditional weakness of MAPS detectors for 4D STEM is their relatively limited dynamic range, due to a relatively low saturation value per pixel. This can be mitigated to some degree by using the large number of pixels on the sensor to spread features of interest in the CBED pattern over many pixels.

In many 4D STEM experiments, it is desirable to simultaneously record very bright and faint features in the CBED pattern without saturating the detector. For example, one may wish to simultaneously record the bright central (0,0) beam (bright-field disc), as well as the faint signal of scattered electrons in the dark-field region. To maximize the signal-to-noise ratio of in the sparse dark-field region. MAPS detectors can be used to perform electron counting, which excludes background noise and normalizes the signal of each detected electron. However, as described above, isolating and counting each primary electron incident on the detector requires sparsity (i.e. <~0.1 e⁻ per pixel), which is generally not satisfied in the intense bright-field disc. Hybrid counting and integrating techniques, such as those provided in the present disclosure, can provide a method of overcoming the challenge of limited dynamic range for 4D STEM using MAPS detectors.

During 4D STEM data acquisition, methods may be used to calculate a sparsity map for each frame. The sparsity map may be a flux mask corresponding to regions of the frame where the number of primary electrons per pixel is low enough to be processed in electron counting mode. Wherein the sparsity map separates pixels into low-flux regions and high-flux regions, the flux mask may be a binary mask. In these sparse regions (primarily in the dark-field area of the diffraction pattern), individual primary electron events can be distinguished and thus electron counting mode can be used to improve SNR by effectively eliminating the Landau noise caused by the variable amount of energy deposited on the sensor by each primary electron. In bright regions (such as the bright-field disc), there is a sufficient number of primary electrons to statistically diminish Landau noise. However, in these bright areas many primary electrons are recorded by the same or neighboring pixels, making it impossible to distinguish individual electron events using electron counting mode algorithms. To maximize the SNR, without sacrificing linearity, a high dynamic range counting mode, such as that described herein, performs electron counting in the sparse regions of the CBED pattern while using conventional integration in non-sparse regions. The intensity of non-sparse regions may be scaled based on an average pixel intensity per primary electron or other statistical measure (e.g., median, mode, and the like) related to pixel intensity per primary electron. Thus, the intensity value for each pixel in the final processed frame approximately corresponds to the actual number of primary electrons incident on each pixel in each frame. By applying this hybrid counting technique, the DE-16 can image the low-angle dark-field regions of the CBED pattern with a high SNR, while simultaneously recording useful information from the more intense bright-field disc.

In an embodiment, the high dynamic range counting methods of the present disclosure allow for automatic detection of sparse regions in each recorded camera frame without prior information from the user, as described with reference to FIG. 6A through FIG. 6C. In this way, electron counting mode may be performed without manually having to define the position and size of the bright and sparse regions in advance.

In principle, hybrid counting may therefore be applicable not only to 4D STEM, but also to other techniques that require high sensitivity and high dynamic range, such as EELS.

4D STEM datasets occupy far more computer memory than a conventional STEM image. For example, a 4D STEM dataset consisting of a 1024×1024 pixel CBED pattern recorded at every pixel of a 1024×1024 STEM raster and stored in 16-bit format will occupy ~2 TB of memory. The acquisition of 4D STEM data also requires very high rates of data transfer compared to 2D STEM imaging. For example, a data transfer rate of ~2 GBs⁻¹ is required for 4D STEM acquisition of 16-bit 1024×1024 pixel CBED patterns at a rate of one frame per millisecond. In practice, the memory occupied by a 4D STEM dataset may be reduced either by limiting the number of spatial pixels in the STEM raster, by using fewer pixels to record patterns in diffraction space, or by downsampling the data after acquisition.

Analysis of 4D STEM datasets typically requires a powerful computer and specialized software. The data presented below has been analyzed using a combination of custom written Python code, as well as libraries from Hyperspy and py4DSTEM. Other software tools currently available for the analysis of 4D STEM data include LiberTEM, Pycroscopy, pixStem, pyXem and the Cornell Spectrum Imager plugin for ImageJ, which was originally written for the analysis of hyperspectral data, but now also includes 4D tools.

Figure 8B:
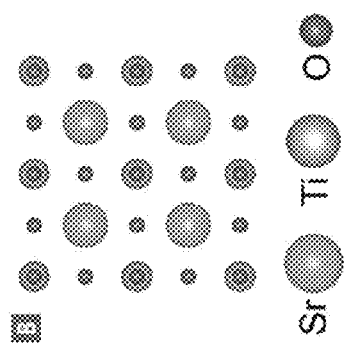
FIG. 8B is a diagram of a crystal structure of $SrTiO_3$, according to an exemplary embodiment of the present disclosure.
Figure 8A:
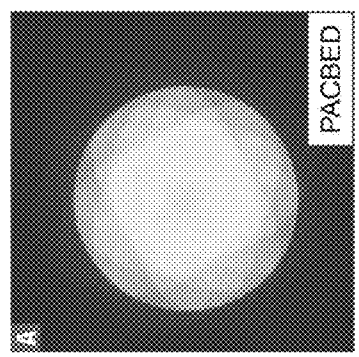
FIG. 8A is a position-averaged convergent beam electron diffraction pattern, according to an exemplary embodiment of the present disclosure.
Figure 8E:
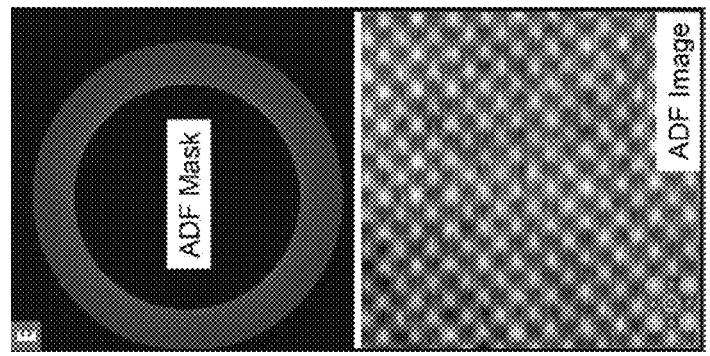
FIG. 8E is an illustration of an annular dark field mask that can be applied to a four-dimensional dataset to generate an annular dark field image, according to an exemplary embodiment of the present disclosure.
Figure 8D:
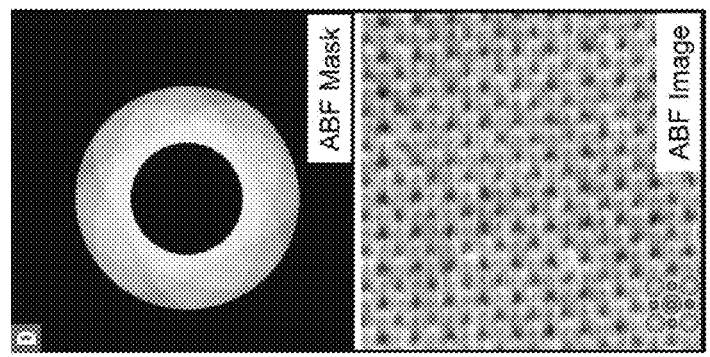
FIG. 8D is an illustration of an annular bright field mask that can be applied to a four-dimensional dataset to generate an annular bright field image, according to an exemplary embodiment of the present disclosure.
Figure 8C:
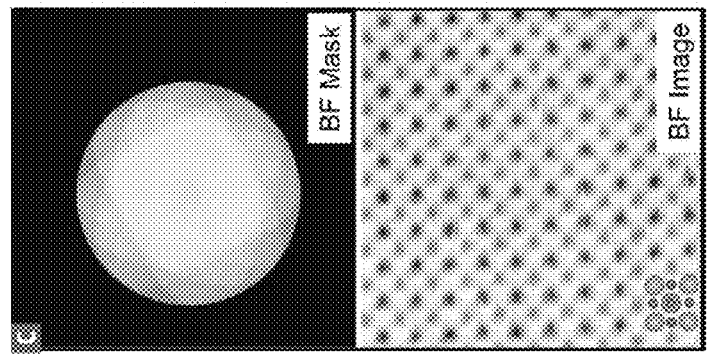
FIG. 8C is an illustration of a bright field mask that can be applied to a four-dimensional dataset to generate a bright field image, according to an exemplary embodiment of the present disclosure.

One of the simplest operations that can be applied to the 4D dataset is to mask an area of diffraction space and integrate the signal from within the mask in each diffraction pattern to recover a 2D STEM image. This is illustrated in FIG. 8A through FIG. 8E for a 4D STEM dataset recorded from a sample of $SrTiO_3$ imaged along a [001] direction, FIG. 8A, for instance, illustrates a position-averaged CBED pattern derived from a 4D STEM dataset acquired from a $SrTiO_3$ imaged along a [001] direction. FIG. 8B provides a diagram of a crystal structure of $SrTiO_3$ in a [001] projection. Using this masking technique, images equivalent to that of any conventional STEM detector can be generated, but with the advantage that the 4D STEM dataset allows complete flexibility in choosing detector angles. Such equivalent images may include a BF image, as in FIG. 8C, an ABF image, as in FIG. 8D, and an ADF image, as in FIG. 8E, wherein the crystal diagram in the lower corner of each Figure indicates atomic column positions, the spacing between adjacent Sr atomic columns being ~3.9 Å. Indeed, one can vary the shape and position of the mask, to generate images from any kind of "virtual detector". For example, one can choose to reduce the convergence angle of the STEM probe such that Bragg discs are well separated and do not overlap. In this mode, diffraction patterns are often referred to as nanobeam electron diffraction (NBED) or nanobeam diffraction (NBD) patterns, rather than CBED patterns. One can then generate an image analogous to that of dark-field TEM by placing a circular mask around a diffracted Bragg disc in the NBED pattern, with the mask acting as a virtual objective aperture.

Figure 9B:
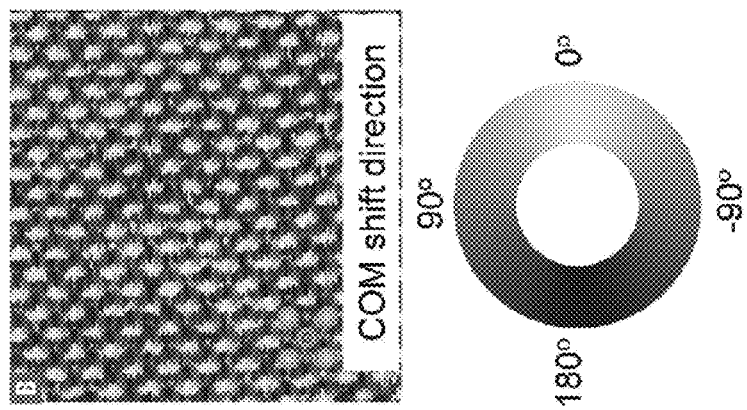
FIG. 9B is an illustration of map showing directions of center of mass shifts in a four-dimensional scanning transmission electron microscopy dataset, according to an exemplary embodiment of the present disclosure.
Figure 9A:
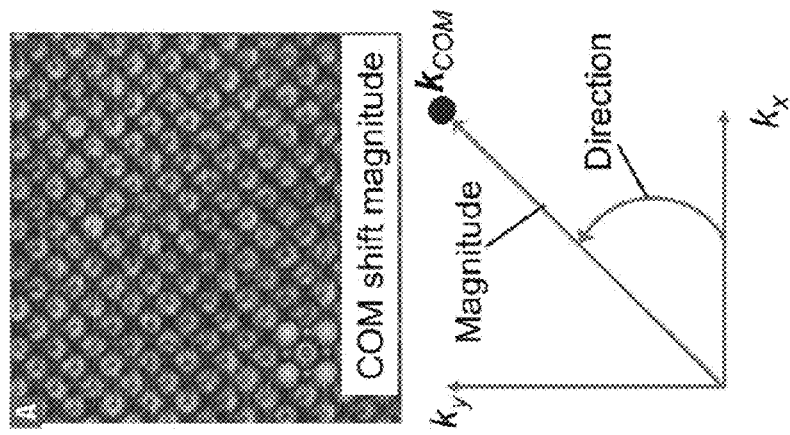
FIG. 9A is an illustration of center of mass shifts in a four-dimensional scanning transmission electron microscopy dataset, according to an exemplary embodiment of the present disclosure.

In addition to reconstructing images using simple masks, 4D STEM enables the reconstruction of differential phase contrast (DPC) images, which were previously only available by using segmented detectors, and "Center of Mass" (COM) images, which are unique to 4D STEM, and have also been referred to as "first moment" or COM DPC images, DPC and COM both essentially measure the magnitude and direction of the average shift in the 2D momentum of the electron probe for each CBED pattern in the 4D STEM dataset, as shown in FIG. 9A and FIG. 9B, respectively. The DPC and COM imaging modes are sensitive to specimen and crystal grain orientation, as well as to electric fields in the specimen, which can cause a shift in the average momentum of the electron probe either by displacing the entire diffraction pattern, or altering the distribution of intensity within the diffraction pattern, depending on the relative length scales of the probe and the source of the field. Magnetic fields can also be detected using DPC and COM when operating the microscope in a Lorentz mode. For a diffraction pattern consisting of pixels with coordinates $k=(k_x, k_y)$, and with the intensity in each pixel defined as $I(k)$, the position of the center of mass in the diffraction pattern can be defined mathematically as $$k_{COM} = \int k\, I(k)\, dk$$

A suitable choice of origin for measuring $k_{COM}$ is the position of the center of the probe in vacuum when no specimen is present, which under ideal conditions should correspond to the center of the optic axis and the center of the detector. The effect of the nuclear potential on the COM is apparent when imaging a specimen at atomic resolution. FIG. 9A and FIG. 9B show the magnitude and direction respectively of the shift of the COM for the same area of the $SrTiO_3$ sample displayed in the images in FIG. 8A through FIG. 8E. The magnitude of the shift of the COM is strongest when the probe is close to, but not directly on top of, the Sr and Ti/O columns, and the direction of the shift is oriented towards the columns. Here, the COM images are measuring the deflection of the negatively charged electron beam by the screened, positively charged atomic nuclei.

As with the generation of conventional STEM images from 4D STEM data, one has complete flexibility to apply a mask of any shape or size to the 4D dataset when generating DPC or COM images, enabling the DPC or COM associated with specific regions of the CBED or NBED pattern to be calculated.

Another application of 4D STEM is mapping local changes in lattice constant and local strain within the specimen. Strain information can be extracted from 4D STEM datasets in different ways. When acquiring 4D STEM data containing NBED patterns with well separated Bragg discs, strain is encoded in the disc positions, or (for very thin samples) the disc center of mass. For polycrystalline or amorphous materials, the ellipticity of NBED patterns may also be useful.

Further techniques that can make use of 4D STEM datasets include mapping of crystal grain orientations in a specimen, where there is some overlap between 4D STEM and the similar technique of nanobeam precession electron diffraction, and electron ptychography, in which computational methods are used to reconstruct the projected potential of the specimen, with the potential for spatial resolution beyond that of traditional STEM imaging techniques. A number of other imaging modes besides those mentioned above may also be performed using 4D STEM. As 4D STEM is a relatively new and growing technique, there may be further imaging modes that are yet to be developed that can take advantage of the wealth of information contained in 4D STEM datasets.

The data presented in herein was acquired on an Aberration Corrected FEI/Thermo Scientific Titan 80-200 S/TEM (Thermo Fisher Scientific, Waltham, Mass. USA), operated at 200 kV with a STEM probe current of ~20 pA and a probe convergence semi-angle of 24.5 mrad. A DE-16 direct detection camera (Direct Electron, San Diego, Calif. USA) was used to record 4D STEM data. Each of the CBED patterns in the 4D STEM data was captured using a 1024× 1024 pixel centered area of the 4096×4096 pixel sensor. A hardware binning of 2 was applied to the CBED patterns, reducing them to 512×512 pixels in size, allowing the 4D STEM dataset to be recorded at a rate of ~1100 frames per second (fps). Higher frame rates (up to >4200 fps) are accessible by further reducing readout area.

The wedge-shaped single crystal $SrTiO_3$ [100] test specimen was prepared by multistep mechanical polishing at 1.6° tilt, followed by further thinning in a Fischione 1050 ion mill (E. A. Fischione Instruments, Inc., Export, Pa., USA). The specimen was gently cleaned using an lbss GV10x DS Asher cleaner (lbss Group Inc., Burlingame, Calif., USA) before being transferred into the TEM column.

4D STEM is a versatile technique that enables a multitude of different types of analyses to be performed on a specimen. These include reconstructing images equivalent to those of any traditional STEM detector of any shape or size, imaging of electric and magnetic fields, mapping strain within a specimen, mapping crystal grain orientations, analyzing medium range order, and generating ptychographic reconstructions with high spatial resolution. Both hybrid PADs and MAPS detectors may be used for 4D STEM. Using a hybrid counting method, implemented on detectors such as the DE-16, dynamic range and sensitivity are sufficient to allow simultaneous imaging of the bright-field disc and low-angle dark-field regions, overcoming a traditional weakness of the MAPS architecture, allowing users to record 4D STEM datasets that take advantage of the angular resolution available to a detector with a high pixel count. 4D STEM methods using pixelated direct electron detectors can complement existing STEM detectors and can readily be implemented on existing STEM instruments.

Next, a hardware description of the image processing control device, according to exemplary embodiments, is described with reference to FIG. 10. In FIG. 10, the image processing control device includes a CPU 1080 which performs the processes described above. The process data and instructions may be stored in memory 1081. These processes and instructions may also be stored on a storage medium disk 1082 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the image processing control device communicates, such as a server or computer.

Further, the claimed advancements may be provided as a utility application, background daemon, or component of an operating system, or combination thereof, executing in conjunction with CPU 1080 and an operating system such as Microsoft Windows 7, UNIX, Solaris, LINUX, Apple MAC-OS and other systems known to those skilled in the art.

The hardware elements in order to achieve the image processing control device may be realized by various circuitry elements, known to those skilled in the art. For example, CPU 1080 may be a Xenon or Core processor from Intel of America or an Opteron processor from AMD of America, or may be other processor types that would be recognized by one of ordinary skill in the art. Alternatively, the CPU 1080 may be implemented on an FPGA, ASIC, PLD or using discrete logic circuits, as one of ordinary skill in the art would recognize. Further, CPU 1080 may be implemented as multiple processors cooperatively working in parallel to perform the instructions of the inventive processes described above.

The image processing control device in FIG. 10 also includes a network controller 1083, such as an Intel Ethernet PRO network interface card from Intel Corporation of America, for interfacing with network 1095. As can be appreciated, the network 1095 can be a public network, such as the Internet, or a private network such as an LAN or WAN network, or any combination thereof and can also include PSTN or ISDN sub-networks. The network 1095 can also be wired, such as an Ethernet network, or can be wireless such as a cellular network including EDGE, 3G and 4G wireless cellular systems. The wireless network can also be WiFi, Bluetooth, or any other wireless form of communication that is known.

The image processing control device further includes a display controller 1084, such as a NVIDIA GeForce GTX or Quadro graphics adaptor from NVIDIA Corporation of America for interfacing with display 1085, such as a Hewlett Packard HPL2445w LCD monitor. A general purpose I/O interface 1086 interfaces with a keyboard and/or mouse 1087 as well as a touch screen panel 1088 on or separate from display 1085. General purpose I/O interface 1086 also connects to a variety of peripherals 1089 including any peripherals appropriate for electron microscopy.

A sound controller 1090 is also provided in the image processing control device, such as Sound Blaster X-Fi Titanium from Creative, to interface with speakers/microphone 1091 thereby providing sounds and/or music.

The general purpose storage controller 1092 connects the storage medium disk 1082 with communication bus 1093, which may be an ISA, EISA, VESA, PCI, or similar, for interconnecting all of the components of the image processing control device. A description of the general features and functionality of the display 1085, keyboard and/or mouse 1087, as well as the display controller 1084, storage controller 1092, network controller 1083, sound controller 1090, and general purpose I/O interface 1086 is omitted herein for brevity as these features are known.

Obviously, numerous modifications and variations are possible in light of the above teachings. It is therefore to be understood that within the scope of the appended claims, the invention may be practiced otherwise than as specifically described herein.

Embodiments of the present disclosure may also be as set forth in the following parentheticals.

(1) An apparatus for generating a hybrid image by high dynamic range counting, comprising processing circuitry configured to acquire an image from a pixelated detector, obtain a sparsity map of the acquired image, the sparsity map indicating low-flux regions of the acquired image and high-flux regions of the acquired image, generate a low-flux image and a high-flux image based on the sparsity map, perform event analysis of the acquired image based on the low-flux image and the high-flux image, the event analysis including detecting, within the low-flux image, incident events by an electron counting mode, multiply, by a normalization constant, resulting intensities of the high-flux image and the detected incident events of the low-flux image, the multiplying normalizing intensity per detected incident event between the low-flux image and the high-flux image, and generate the hybrid image by merging the low-flux image and the high-flux image.

(2) The apparatus according to (1), wherein the sparsity map is a predetermined sparsity map.

(3) The apparatus according to either (1) or (2), wherein the processing circuitry is configured to calculate the sparsity map of the acquired image by evaluating, for each pixel within a group of pixels of the acquired image, a corresponding pixel value relative to a pixel value threshold, and assigning, to a single pixel within the group of pixels of the acquired image, a sparsity map value based on the evaluation, wherein a corresponding pixel value below the pixel value threshold indicates a low-flux region, and a corresponding pixel value above the pixel value threshold indicates a high-flux region.

(4) The apparatus according to either (1) or (2), wherein the processing circuitry is configured to calculate the sparsity map of the acquired image by evaluating, for each pixel within a group of pixels of the acquired image, a corresponding pixel value relative to a pixel value threshold, and assigning, to a plurality of pixels within the group of pixels of the acquired image, a sparsity map value based on the evaluation, wherein a corresponding pixel value below the pixel value threshold indicates a low-flux region, and a corresponding pixel value above the pixel value threshold indicates a high-flux region.

(5) The apparatus according to any one of (1) to (4), wherein the processing circuitry is configured to assign the sparsity map value based on the evaluation by determining a pixel ratio of the group of pixels of the acquired image, the pixel ratio defining a number of pixels within the group of pixels of the acquired image above the pixel value threshold relative to a number of pixels within the group of pixels of the acquired image below the pixel value threshold.

(6) The apparatus according to any one of (1) to (5), wherein the processing circuitry is configured to calculate the sparsity map of the acquired image by evaluating, for each pixel within a group of pixels of the acquired image, a corresponding pixel value relative to a pixel value threshold, the group of pixels of the acquired image being one or more groups of pixels of the acquired image and the pixel value threshold being unique to each of the one or more groups of pixels of the acquired image.

(7) The apparatus according to any one of (1) to (6), wherein the processing circuitry is configured to generate the low-flux image and the high-flux image by applying, based on the sparsity map, a mask to the acquired image, the applied mask assigning values to pixels of the acquired image representative of the low-flux regions of the acquired image and the high-flux regions of the acquired image.

(8) A method for generating a hybrid image by high dynamic range counting, comprising acquiring, by processing circuitry, an image from a pixelated detector, obtaining, by the processing circuitry, a sparsity map of the acquired image, the sparsity map indicating low-flux regions of the acquired image and high-flux regions of the acquired image, generating, by the processing circuitry, a low-flux image and a high-flux image based on the sparsity map, performing, by the processing circuitry, event analysis of the acquired image based on the low-flux image and the high-flux image, the event analysis including detecting, within the low-flux image, incident events by an electron counting mode, multiplying, by the processing circuitry and by a normalization constant, resulting intensities of the high-flux image and the detected incident events of the low-flux image, the multiplying normalizing intensity per detected incident event between the low-flux image and the high-flux image, and generating, by the processing circuitry, the hybrid image by merging the low-flux image and the high-flux image.

(9) The method according to (8), wherein the sparsity map is a predetermined sparsity map.

(10) The method according to either (8) or (9), further comprising calculating the sparsity map of the acquired image by evaluating, for each pixel within a group of pixels of the acquired image, a corresponding pixel value relative to a pixel value threshold, and assigning, to a single pixel within the group of pixels of the acquired image, a sparsity map value based on the evaluation, wherein a corresponding pixel value below the pixel value threshold indicates a low-flux region, and a corresponding pixel value above the pixel value threshold indicates a high-flux region.

(11) The method according to either (8) or (9), further comprising calculating the sparsity map of the acquired image by evaluating, for each pixel within a group of pixels of the acquired image, a corresponding pixel value relative to a pixel value threshold, and assigning, to a plurality of pixels within the group of pixels of the acquired image, a sparsity map value based on the evaluation, wherein a corresponding pixel value below the pixel value threshold indicates a low-flux region, and a corresponding pixel value above the pixel value threshold indicates a high-flux region.

(12) The method according to any one of (8) to (11), wherein the assigning the sparsity map value based on the evaluation includes determining a pixel ratio of the group of pixels of the acquired image, the pixel ratio defining a number of pixels within the group of pixels of the acquired image above the pixel value threshold relative to a number of pixels within the group of pixels of the acquired image below the pixel value threshold.

(13) The method according to any one of (8) to (12), wherein the calculating the sparsity map of the acquired image includes evaluating, for each pixel within a group of pixels of the acquired image, a corresponding pixel value relative to a pixel value threshold, the group of pixels of the acquired image being one or more groups of pixels of the acquired image and the pixel value threshold being unique to each of the one or more groups of pixels of the acquired image.

(14) The method according to any one of (8) to (13), wherein the generating the low-flux image and the high-flux image includes applying, based on the sparsity map, a mask to the acquired image, the applied mask assigning values to pixels of the acquired image representative of the low-flux regions of the acquired image and the high-flux regions of the acquired image.

(15) A non-transitory computer-readable storage medium storing computer-readable instructions that, when executed by a computer, cause the computer to perform a method of generating a hybrid image by high dynamic range counting, comprising acquiring an image from a pixelated detector, obtaining a sparsity map of the acquired image, the sparsity map indicating low-flux regions of the acquired image and high-flux regions of the acquired image, generating a low-flux image and a high-flux image based on the sparsity map, performing event analysis of the acquired image based on the low-flux image and the high-flux image, the event analysis including detecting, within the low-flux image, incident events by an electron counting mode, multiplying, by a normalization constant, resulting intensities of the high-flux image and the detected incident events of the low-flux image, the multiplying normalizing intensity per detected incident event between the low-flux image and the high-flux image, and generating the hybrid image by merging the low-flux image and the high-flux image.

(16) The non-transitory computer-readable storage medium according to (15), wherein the sparsity map is a predetermined sparsity map.

(17) The non-transitory computer-readable storage medium according to either (15) or (16), further comprising calculating the sparsity map of the acquired image by evaluating, for each pixel within a group of pixels of the acquired image, a corresponding pixel value relative to a pixel value threshold, and assigning, to a single pixel within the group of pixels of the acquired image, a sparsity map value based on the evaluation, wherein a corresponding pixel value below the pixel value threshold indicates a low-flux region, and a corresponding pixel value above the pixel value threshold indicates a high-flux region.

(18) The non-transitory computer-readable storage medium according to either (15) or (16), further comprising calculating the sparsity map of the acquired image by evaluating, for each pixel within a group of pixels of the acquired image, a corresponding pixel value relative to a pixel value threshold, and assigning, to a plurality of pixels within the group of pixels of the acquired image, a sparsity map value based on the evaluation, wherein a corresponding pixel value below the pixel value threshold indicates a low-flux region, and a corresponding pixel value above the pixel value threshold indicates a high-flux region.

(19) The non-transitory computer-readable storage medium according to any one of (15) to (18), wherein the assigning the sparsity map value based on the evaluation includes determining a pixel ratio of the group of pixels of the acquired image, the pixel ratio defining a number of pixels within the group of pixels of the acquired image above the pixel value threshold relative to a number of pixels within the group of pixels of the acquired image below the pixel value threshold.

(20) The non-transitory computer-readable storage medium according to any one of (15) to (19), wherein the calculating the sparsity map of the acquired image includes evaluating, for each pixel within a group of pixels of the acquired image, a corresponding pixel value relative to a pixel value threshold, the group of pixels of the acquired image being one or more groups of pixels of the acquired image and the pixel value threshold being unique to each of the one or more groups of pixels of the acquired image.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. An apparatus for generating a hybrid image by high dynamic range counting, comprising:
    processing circuitry configured to
        acquire an image from a pixelated detector,
        obtain a sparsity map of the acquired image, the sparsity map indicating low-flux regions of the acquired image and high-flux regions of the acquired image,
        generate a low-flux image and a high-flux image based on the sparsity map,
        perform event analysis of the acquired image based on the low-flux image and the high-flux image, the event analysis including detecting, within the low-flux image, incident events by an electron counting mode,
        multiply, by a normalization constant, resulting intensities of the high-flux image and the detected incident events of the low-flux image, the multiplying normalizing intensity per detected incident event between the low-flux image and the high-flux image, and
        generate the hybrid image by merging the low-flux image and the high-flux image.

2. The apparatus according to claim 1, wherein the sparsity map is a predetermined sparsity map.

3. The apparatus according to claim 1, wherein the processing circuitry is configured to calculate the sparsity map of the acquired image by
    evaluating, for each pixel within a group of pixels of the acquired image, a corresponding pixel value relative to a pixel value threshold, and assigning, to a single pixel within the group of pixels of the acquired image, a sparsity map value based on the evaluation, wherein
a corresponding pixel value below the pixel value threshold indicates a low-flux region, and
a corresponding pixel value above the pixel value threshold indicates a high-flux region.

4. The apparatus according to claim 1, wherein the processing circuitry is configured to calculate the sparsity map of the acquired image by
evaluating, for each pixel within a group of pixels of the acquired image, a corresponding pixel value relative to a pixel value threshold, and
assigning, to a plurality of pixels within the group of pixels of the acquired image, a sparsity map value based on the evaluation, wherein
a corresponding pixel value below the pixel value threshold indicates a low-flux region, and
a corresponding pixel value above the pixel value threshold indicates a high-flux region.

5. The apparatus according to claim 4, wherein the processing circuitry is configured to assign the sparsity map value based on the evaluation by
determining a pixel ratio of the group of pixels of the acquired image, the pixel ratio defining a number of pixels within the group of pixels of the acquired image above the pixel value threshold relative to a number of pixels within the group of pixels of the acquired image below the pixel value threshold.

6. The apparatus according to claim 1, wherein the processing circuitry is configured to calculate the sparsity map of the acquired image by
evaluating, for each pixel within a group of pixels of the acquired image, a corresponding pixel value relative to a pixel value threshold, the group of pixels of the acquired image being one or more groups of pixels of the acquired image and the pixel value threshold being unique to each of the one or more groups of pixels of the acquired image.

7. The apparatus according to claim 1, wherein the processing circuitry is configured to generate the low-flux image and the high-flux image by
applying, based on the sparsity map, a mask to the acquired image, the applied mask assigning values to pixels of the acquired image representative of the low-flux regions of the acquired image and the high-flux regions of the acquired image.

8. A method for generating a hybrid image by high dynamic range counting, comprising:
acquiring, by processing circuitry, an image from a pixelated detector;
obtaining, by the processing circuitry, a sparsity map of the acquired image, the sparsity map indicating low-flux regions of the acquired image and high-flux regions of the acquired image;
generating, by the processing circuitry, a low-flux image and a high-flux image based on the sparsity map;
performing, by the processing circuitry, event analysis of the acquired image based on the low-flux image and the high-flux image, the event analysis including detecting, within the low-flux image, incident events by an electron counting mode;
multiplying, by the processing circuitry and by a normalization constant, resulting intensities of the high-flux image and the detected incident events of the low-flux image, the multiplying normalizing intensity per detected incident event between the low-flux image and the high-flux image; and
generating, by the processing circuitry, the hybrid image by merging the low-flux image and the high-flux image.

9. The method according to claim 8, wherein the sparsity map is a predetermined sparsity map.

10. The method according to claim 8, further comprising calculating the sparsity map of the acquired image by
evaluating, for each pixel within a group of pixels of the acquired image, a corresponding pixel value relative to a pixel value threshold, and
assigning, to a single pixel within the group of pixels of the acquired image, a sparsity map value based on the evaluation, wherein
a corresponding pixel value below the pixel value threshold indicates a low-flux region, and
a corresponding pixel value above the pixel value threshold indicates a high-flux region.

11. The method according to claim 8, further comprising calculating the sparsity map of the acquired image by
evaluating, for each pixel within a group of pixels of the acquired image, a corresponding pixel value relative to a pixel value threshold, and
assigning, to a plurality of pixels within the group of pixels of the acquired image, a sparsity map value based on the evaluation, wherein
a corresponding pixel value below the pixel value threshold indicates a low-flux region, and
a corresponding pixel value above the pixel value threshold indicates a high-flux region.

12. The method according to claim 11, wherein the assigning the sparsity map value based on the evaluation includes
determining a pixel ratio of the group of pixels of the acquired image, the pixel ratio defining a number of pixels within the group of pixels of the acquired image above the pixel value threshold relative to a number of pixels within the group of pixels of the acquired image below the pixel value threshold.

13. The method according to claim 8, wherein the calculating the sparsity map of the acquired image includes
evaluating, for each pixel within a group of pixels of the acquired image, a corresponding pixel value relative to a pixel value threshold, the group of pixels of the acquired image being one or more groups of pixels of the acquired image and the pixel value threshold being unique to each of the one or more groups of pixels of the acquired image.

14. The method according to claim 8, wherein the generating the low-flux image and the high-flux image includes
applying, based on the sparsity map, a mask to the acquired image, the applied mask assigning values to pixels of the acquired image representative of the low-flux regions of the acquired image and the high-flux regions of the acquired image.

15. A non-transitory computer-readable storage medium storing computer-readable instructions that, when executed by a computer, cause the computer to perform a method of generating a hybrid image by high dynamic range counting, comprising:
acquiring an image from a pixelated detector;
obtaining a sparsity map of the acquired image, the sparsity map indicating low-flux regions of the acquired image and high-flux regions of the acquired image;

generating a low-flux image and a high-flux image based on the sparsity map;

performing event analysis of the acquired image based on the low-flux image and the high-flux image, the event analysis including detecting, within the low-flux image, incident events by an electron counting mode;

multiplying, by a normalization constant, resulting intensities of the high-flux image and the detected incident events of the low-flux image, the multiplying normalizing intensity per detected incident event between the low-flux image and the high-flux image; and generating the hybrid image by merging the low-flux image and the high-flux image.

16. The non-transitory computer-readable storage medium according to claim 15, wherein the sparsity map is a predetermined sparsity map.

17. The non-transitory computer-readable storage medium according to claim 15, further comprising calculating the sparsity map of the acquired image by evaluating, for each pixel within a group of pixels of the acquired image, a corresponding pixel value relative to a pixel value threshold, and assigning, to a single pixel within the group of pixels of the acquired image, a sparsity map value based on the evaluation, wherein a corresponding pixel value below the pixel value threshold indicates a low-flux region, and a corresponding pixel value above the pixel value threshold indicates a high-flux region.

18. The non-transitory computer-readable storage medium according to claim 15, further comprising calculating the sparsity map of the acquired image by evaluating, for each pixel within a group of pixels of the acquired image, a corresponding pixel value relative to a pixel value threshold, and assigning, to a plurality of pixels within the group of pixels of the acquired image, a sparsity map value based on the evaluation, wherein a corresponding pixel value below the pixel value threshold indicates a low-flux region, and a corresponding pixel value above the pixel value threshold indicates a high-flux region.

19. The non-transitory computer-readable storage medium according to claim 18, wherein the assigning the sparsity map value based on the evaluation includes determining a pixel ratio of the group of pixels of the acquired image, the pixel ratio defining a number of pixels within the group of pixels of the acquired image above the pixel value threshold relative to a number of pixels within the group of pixels of the acquired image below the pixel value threshold.

20. The non-transitory computer-readable storage medium according to claim 15, wherein the calculating the sparsity map of the acquired image includes evaluating, for each pixel within a group of pixels of the acquired image, a corresponding pixel value relative to a pixel value threshold, the group of pixels of the acquired image being one or more groups of pixels of the acquired image and the pixel value threshold being unique to each of the one or more groups of pixels of the acquired image.

* * * * *